United States Patent
Ichijo et al.

(10) Patent No.: US 8,114,760 B2
(45) Date of Patent: Feb. 14, 2012

(54) METHOD FOR MANUFACTURING MICROCRYSTALLINE SEMICONDUCTOR AND THIN FILM TRANSISTOR

(75) Inventors: Mitsuhiro Ichijo, Zama (JP); Kazutaka Kuriki, Ebina (JP); Tomokazu Yokoi, Atsugi (JP); Toshiya Endo, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/908,228

(22) Filed: Oct. 20, 2010

(65) Prior Publication Data

US 2011/0097877 A1  Apr. 28, 2011

(30) Foreign Application Priority Data

Oct. 23, 2009  (JP) .................. 2009-244375

(51) Int. Cl.
*H01L 21/00* (2006.01)
(52) U.S. Cl. ................ 438/478; 257/E21.001
(58) Field of Classification Search .............. 118/723 R, 118/723 MW, 723 ME, 723 MR, 723 MA, 118/723 E, 723 ER; 257/E21.001; 427/578, 427/579; 438/478
See application file for complete search history.

(56) References Cited

U.S. PATENT DOCUMENTS

| | | | |
|---|---|---|---|
| 4,409,134 A | 10/1983 | Yamazaki | |
| 4,723,508 A | 2/1988 | Yamazaki et al. | |
| 6,337,224 B1 | 1/2002 | Okamoto et al. | |
| 6,488,995 B1 | 12/2002 | Nishimoto et al. | |
| 7,594,479 B2 | 9/2009 | Yonezawa et al. | |
| 7,611,930 B2 | 11/2009 | Yamazaki et al. | |
| 2008/0119030 A1* | 5/2008 | Kunii | 438/479 |
| 2009/0002591 A1 | 1/2009 | Yamazaki et al. | |
| 2009/0047774 A1 | 2/2009 | Yamazaki | |

FOREIGN PATENT DOCUMENTS

| | | |
|---|---|---|
| JP | 11-233801 | 8/1999 |
| JP | 2000-277439 | 10/2000 |
| JP | 2005-049832 | 2/2005 |
| JP | 2009-044134 | 2/2009 |
| JP | 2009-071280 | 4/2009 |
| JP | 2009-071286 | 4/2009 |

\* cited by examiner

*Primary Examiner* — N Drew Richards
*Assistant Examiner* — Daniel Shook
(74) *Attorney, Agent, or Firm* — Eric J. Robinson; Robinson Intellectual Property Law Office, P.C.

(57) ABSTRACT

A technique for manufacturing a microcrystalline semiconductor layer with high mass productivity is provided. In a reaction chamber of a plasma CVD apparatus, an upper electrode and a lower electrode are provided in almost parallel to each other. A hollow portion is formed in the upper electrode, and the upper electrode includes a shower plate having a plurality of holes formed on a surface of the upper electrode which faces the lower electrode. A substrate is provided over the lower electrode. A gas containing a deposition gas and hydrogen is supplied to the reaction chamber from the shower plate through the hollow portion of the upper electrode, and a rare gas is supplied to the reaction chamber from a portion different from the upper electrode. Accordingly, high-frequency power is supplied to the upper electrode to generate plasma, so that a microcrystalline semiconductor layer is formed over the substrate.

10 Claims, 19 Drawing Sheets

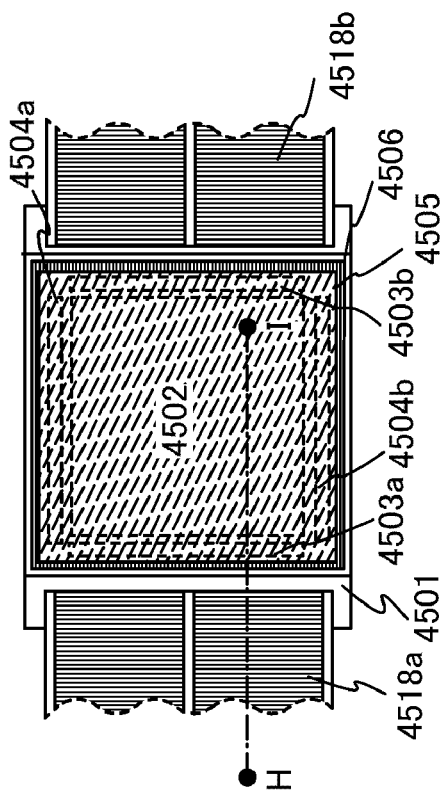
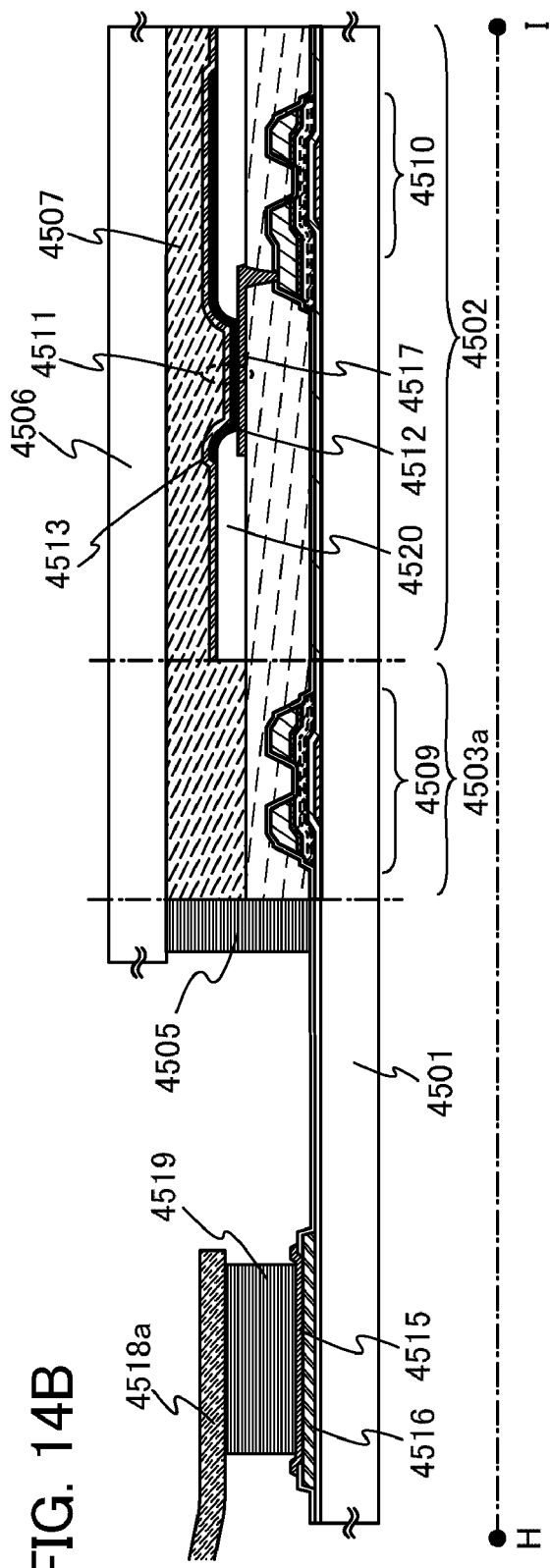
FIG. 14A
FIG. 14B

METHOD FOR MANUFACTURING MICROCRYSTALLINE SEMICONDUCTOR AND THIN FILM TRANSISTOR

BACKGROUND OF THE INVENTION

1. Field of the Invention

The present invention relates to a method for manufacturing a microcrystalline semiconductor, a method for manufacturing a thin film transistor, and a display device using the thin film transistor.

2. Description of the Related Art

As a kind of field-effect transistor, a thin-film transistor (also referred to as a TFT) having a channel formation region which is formed in a semiconductor layer formed over a substrate having an insulating surface, is known. A technique in which a microcrystalline semiconductor layer having field-effect mobility higher than an amorphous semiconductor layer is used for the semiconductor layer used in the thin film transistor has been disclosed (Patent Document 1). A technique in which a semiconductor layer is formed using silane ($SiH_4$) which is diluted with hydrogen and a rare gas element has been disclosed (Patent Document 2). A typical application example of the thin film transistor is a liquid crystal television device in which the thin film transistor has been put to practical use as a switching transistor in each pixel that forms a display screen.

REFERENCE

Patent Document

[Patent Document 1] Japanese Published Patent Application No. 2009-044134
[Patent Document 2] Japanese Published Patent Application No. 2005-049832

SUMMARY OF THE INVENTION

An example of a conventional plasma CVD apparatus used for manufacturing a microcrystalline semiconductor layer will be described with reference to FIG. 3. FIG. 3 is a cross-sectional schematic view illustrating one structure of a conventional plasma CVD apparatus. A reaction chamber 100 of the plasma CVD apparatus is provided with a first electrode 101 (also referred to as an upper electrode) and a second electrode 103 (also referred to as a lower electrode) which is opposite to the first electrode 101. The first electrode 101 and the second electrode 103 are flat electrodes and are provided in almost parallel to each other at a certain distance. The second electrode 103 is supported by a supporter 104 and a substrate 110 over which a microcrystalline semiconductor layer is deposited is provided over the second electrode 103.

In the conventional plasma CVD apparatus, a gas 107 in which a deposition gas, hydrogen, and a rare gas are mixed is supplied from a gas supply portion 123 to the reaction chamber through a hollow portion of the first electrode 101 and holes 102. The gas 107 supplied to the reaction chamber 100 is evacuated from an evacuation unit 130 through an evacuation tube 105.

In such a structure, the flow velocity (supply rate) of the gas 107 passing through the holes 102 becomes fast and high-frequency power is not efficiently conducted to the gas 107; therefore, reaction species which are needed for deposition are not sufficiently generated. Note that when an opening area of the holes 102 provided in the first electrode 101 is increased, the supply rate of the gas can be reduced; however, when an increase in the opening area of the holes 102 causes a problem in that the uniformity of a film thickness within a deposition surface is decreased.

Although higher field-effect mobility can be obtained with the use of a microcrystalline semiconductor layer than in the case of using an amorphous semiconductor layer, there is a problem in that a deposition rate is slow and mass productivity is low. Low uniformity of the film thickness within the deposition surface causes a variation in electric characteristics of a thin film transistor.

It is an object of one embodiment of the present invention to increase the deposition rate of a microcrystalline semiconductor layer to form a microcrystalline semiconductor layer with high mass productivity.

It is another object of one embodiment of the present invention to form a microcrystalline semiconductor layer with high uniformity of the film thickness within a deposition surface.

It is another object of one embodiment of the present invention to manufacture, with high mass productivity, a high reliable thin film transistor having excellent electric characteristics and a display device including the thin film transistor.

According to one embodiment of the present invention, a first electrode and a second electrode are provided so as to face each other in a reaction chamber of a plasma CVD apparatus. A hollow portion is formed in the first electrode and a plurality of holes is formed on a surface of the first electrode which faces the second electrode. A gas containing a deposition gas and hydrogen is supplied to the reaction chamber through the hollow portion of the first electrode and the holes provided in the first electrode, and a rare gas is supplied from a portion different from the first electrode to the reaction chamber. Accordingly, high-frequency power is supplied to the first electrode to generate plasma, so that a microcrystalline semiconductor layer is formed over a substrate which is provided over the second electrode.

According to one embodiment of the present invention, a first electrode and a second electrode are provided so as to face each other in a reaction chamber of a plasma CVD apparatus. A hollow portion is formed in the first electrode and a plurality of holes is formed on a surface of the first electrode which faces the second electrode. A gas containing a deposition gas and hydrogen is supplied to the reaction chamber through the hollow portion of the first electrode and the holes provided in the first electrode, and a rare gas is supplied from a portion different from a space which is interposed between the first electrode and the second electrode. Accordingly, high-frequency power is supplied to the first electrode to generate plasma, so that a microcrystalline semiconductor layer is formed over a substrate which is provided over the second electrode.

According to one embodiment of the present invention, a first electrode and a second electrode are provided so as to face each other in a reaction chamber of a plasma CVD apparatus. A hollow portion is formed in the first electrode and a plurality of holes is formed on a surface of the first electrode which faces the second electrode. A gas containing a deposition gas and hydrogen is supplied to the reaction chamber through the hollow portion of the first electrode and the holes provided in the first electrode, and an excited rare gas is supplied from a portion different from a space which is interposed between the first electrode and the second electrode. Accordingly, high-frequency power is supplied to the first electrode to generate plasma, so that a microcrystalline semiconductor layer is formed over a substrate which is provided over the second electrode.

In addition to the above structures, a unit for heating the substrate may be provided. The size of crystal grains in the microcrystalline semiconductor layer and film quality can be adjusted by heating the substrate.

For the rare gas, one or more of helium (He), neon (Ne), argon (Ar), krypton (Kr), xenon (Xe), and radon (Rn) can be used.

As the deposition gas, a gas containing silicon (Si) or germanium (Ge) can be used. As a deposition gas containing silicon, silane ($SiH_4$), disilane ($Si_2H_6$), dichlorosilane ($SiH_2Cl_2$), $SiHCl_3$, silicon chloride ($SiCl_4$), silicon fluoride ($SiF_4$), or the like can be used. As a deposition gas containing germanium, germane ($GeH_4$), digermane ($Ge_2H_6$), germane fluoride ($GeF_4$), or the like can be used.

A microcrystalline semiconductor layer is deposited using a deposition gas diluted with hydrogen. Microcrystalline silicon, microcrystalline silicon germanium, microcrystalline germanium, or the like is formed using a mixture which is obtained by diluting the deposition gas with hydrogen whose flow rate is 10 to 2000 times, preferably 10 to 200 times that of the deposition gas. The deposition temperature in that case is from room temperature to 300° C., preferably, 200° C. to 280° C.

Further, in order to impart p-type conductivity to the semiconductor layer, a gas containing boron (B) such as borane ($BH_3$) or diborane ($B_2H_6$) may be contained. Alternatively, in order to impart n-type conductivity to the semiconductor layer, a gas containing phosphorus (P) or arsenic (As) such as phosphine ($PH_3$) or arsine ($AsH_3$) may be contained.

In the case where a rare gas is supplied from a portion different from holes provided in the first electrode, as compared to the case where a gas containing a deposition gas and hydrogen and a rare gas are supplied from the holes provided in the first electrode at the same time, supply rate (flow velocity) of the deposition gas supplied from the first electrode can be decreased, without change in the total amount of gas supplied to the reaction chamber.

According to one embodiment of the present invention, the deposition rate and the uniformity of the film thickness within a deposition surface can be improved. This is because high-frequency power is efficiently supplied to the gas supplied to the reaction chamber by decreasing the supply rate of a deposition gas, so that more reaction species which contribute to deposition can be generated.

A microcrystalline semiconductor layer can be formed with high mass productivity. A thin film transistor with less variation in electric characteristics can be manufactured with high mass productivity.

BRIEF DESCRIPTION OF THE DRAWINGS

In the accompanying drawings:

FIGS. 14A and 14B illustrate an example of a display device;

DETAILED DESCRIPTION OF THE INVENTION

Figure 1A:
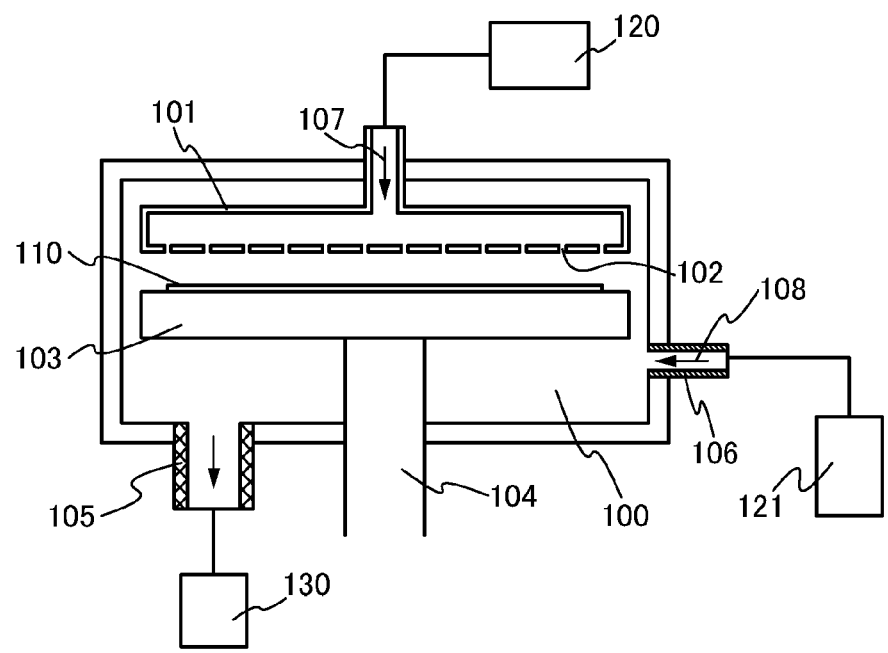
FIGS. 1A and 1B illustrate a reaction chamber of a plasma CVD apparatus.

Embodiments are described below in detail using the drawings. Note that the disclosed invention is not limited to the following description and it will be easily understood by those skilled in the art that various changes and modifications can be made in modes and details without departing from the spirit and the scope of the disclosed invention. Therefore, the disclosed invention is not interpreted as being limited to the description of the embodiments below. Note that in structures of the invention described hereinafter, the same portions or portions having similar functions are denoted by the same reference numerals in different drawings, and description thereof is not repeated.

Embodiment 1

One mode of a deposition apparatus of the present invention and a deposition process of a semiconductor layer will be described with reference to FIGS. 1A and 1B.

FIG. 1A is a cross-sectional schematic view illustrating an example of a plasma CVD apparatus which is described in this embodiment. In FIG. 1A, the reaction chamber 100 is a vacuum chamber and is formed using a material having rigidity such as aluminum or stainless steel. Although the reaction chamber of the plasma CVD apparatus in this embodiment is formed using aluminum, it may be formed using stainless steel and the inside thereof is coated with aluminum by thermal spraying in order to increase its mechanical strength. In addition, the reaction chamber of the plasma CVD apparatus in this embodiment can be disassembled for maintenance, whereby maintenance can be regularly carried out.

The reaction chamber 100 is provided with the first electrode 101 (also referred to as an upper electrode) and the second electrode 103 (also referred to as a lower electrode) which is opposite to the first electrode 101. The first electrode 101 and the second electrode 103 are flat electrodes and are provided in almost parallel to each other at a certain distance.

First, the substrate 110 is carried into the reaction chamber 100 from a carry-in entrance (not illustrated) provided on a side surface of the reaction chamber 100 and is provided over the second electrode 103. The second electrode 103 incorporates a heater (not illustrated) to heat a substrate, and the temperature of the heater is controlled by a heater controller (not illustrated). The temperature of the substrate 110 during deposition can be set to from room temperature to 300° C., preferably 200° C. to 280° C. by the heater and the heater controller. For example, a sheathed heater can be used as the heater.

As the substrate 110, in addition to a glass substrate and a ceramic substrate, a plastic substrate or the like with heat resistance to withstand a process temperature in this manufacturing process can be used. In the case where the substrate does not need a light-transmitting property, a metal substrate, such as a stainless steel alloy substrate, provided with an insulating layer on its surface may be used. As a glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Further, as the substrate 110, a glass substrate with any of the following sizes can be used: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2950 mm×3400 mm).

A high-frequency power supply unit (not illustrated) is connected to the first electrode 101. The first electrode 101 is insulated from the reaction chamber 100 so that high-frequency power does not leak. The second electrode 103 is grounded, and the substrate 110 can be placed on the second electrode 103. The second electrode 103 is supported by the supporter 104. An electrode distance (also referred to as a gap) between the first electrode 101 and the second electrode 103 can be adjusted as appropriate by moving the supporter 104 up and down.

The high-frequency power supply unit includes a high-frequency power source, a matching box, a high-frequency cut filter, and the like. High-frequency power supplied from the high-frequency power source is supplied to the first electrode 101.

The high-frequency power source supplies a high-frequency power with a frequency of 100 MHz or less. In the case where a large substrate of the seventh or later generation is used as a substrate placed on the second electrode 103, the high-frequency power source preferably supplies a high-frequency power with a wavelength of approximately 10 m or more. Typically, a high-frequency power with a frequency of 13.56 MHz or less, for example, from 1 MHz to 13.56 MHz inclusive, is preferably supplied. When the high-frequency power source supplies a high-frequency power with a frequency in the above range, even if a large substrate of the seventh or later generation is placed on the second electrode 103 and glow discharging is performed, plasma can be generated uniformly without the adverse effect of a surface standing wave; therefore, a high quality uniform film can be formed over an entire surface of the substrate.

A hollow portion is formed in the first electrode 101, and a plurality of holes 102 is formed on a surface of the first electrode 101 which faces the second electrode 103. In general, such an electrode shape or an electrode surface is called a shower head, a shower plate, or the like. FIG. 1B illustrates a plan view of a shower plate of the first electrode 101.

In addition, a supply tube 106 for supplying a rare gas to the reaction chamber 100 is provided on a side surface of the reaction chamber 100. The supply tube 106 may be provided in a place other than the side surface of the reaction chamber 100. For example, it may be provided on an upper surface or a bottom surface of the reaction chamber 100. Instead of the supply tube 106, the second electrode 103 may have a hollow structure similarly to the first electrode 101 and may include holes in a position which does not interfere with the substrate 110. In the case where holes are provided in the second electrode 103, it may be provided on a side surface of the second electrode 103 or a surface to which the supporter 104 is connected.

Next, the gas 107 containing a deposition gas and hydrogen, which is supplied from the gas supply portion 120, passes through the hollow portion of the first electrode 101 to be supplied to the reaction chamber through the holes 102. It is preferable that as for the mixture ratio of the deposition gas and hydrogen, flow rate of hydrogen be 10 to 2000 times, preferably 10 to 200 times that of the deposition gas.

As the deposition gas, a gas containing silicon or germanium can be used. As a deposition gas containing silicon, silane ($SiH_4$), disilane ($Si_2H_6$), dichlorosilane ($SiH_2Cl_2$), $SiHCl_3$, silicon chloride ($SiCl_4$), silicon fluoride ($SiF_4$), or the like can be used. As a deposition gas containing germanium, germane ($GeH_4$), digermane ($Ge_2H_6$), germane fluoride ($GeF_4$), or the like can be used.

Next, a gas 108 is supplied from the gas supply portion 121 to the reaction chamber 100 through the supply tube 106. A rare gas can be used for the gas 108. For example, argon (Ar) can be used.

The evacuation tube 105 is connected to the evacuation unit 130. The evacuation unit 130 has a function of performing vacuum evacuation in the reaction chamber and a function of controlling the reaction chamber to be kept at a predetermined pressure when a gas is supplied to the reaction chamber. Note that a plurality of evacuation tubes 105 may be provided.

Next, high-frequency power is supplied to the first electrode 101 from the high-frequency power supply unit (not illustrated) which is connected to the first electrode 101 to generate plasma between the first electrode 101 and the second electrode 103, whereby a microcrystalline semiconductor layer is deposited over the substrate 110.

Then, supply of the high-frequency power, the gas 107, and the gas 108 is stopped and the substrate 110 over which the microcrystalline semiconductor layer is deposited is carried out from the reaction chamber.

Note that when a gas containing boron (B) which is an impurity imparting p-type conductivity, such as borane ($BH_3$) or diborane ($B_2H_6$) is contained in the gas 107, the microcrystalline semiconductor layer can be formed as an impurity semiconductor layer showing p-type conductivity (also referred to as a p-type impurity semiconductor layer). Alternatively, when a gas containing phosphorus (P) or arsenic (As) which is an impurity imparting n-type conductivity, such as phosphine ($PH_3$) or arsine ($AsH_3$) is contained in the gas 107, the microcrystalline semiconductor layer can be formed as an impurity semiconductor layer showing n-type conductivity (also referred to as an n-type impurity semiconductor layer).

Further, for example, in the case where a deposited microcrystalline semiconductor layer becomes an n-type impurity semiconductor layer without intention, the microcrystalline semiconductor layer can be made close to an i-type semiconductor layer (intrinsic semiconductor layer) when a gas containing boron (B) which is an impurity imparting p-type conductivity is contained in the gas 107. In the case where a p-type impurity semiconductor layer is obtained without intention, the microcrystalline semiconductor layer can be made close to an i-type semiconductor layer (intrinsic semiconductor layer) when a gas containing phosphorus (P) or arsenic (As) which is an impurity imparting n-type conductivity is contained in the gas 107.

With the use of the CVD apparatus described in this embodiment, a deposition gas, hydrogen, and a rare gas are not supplied to the reaction chamber only through the holes provided in the first electrode but a deposition gas and hydrogen are supplied to the reaction chamber through the holes provided in the first electrode and a rare gas is supplied to the reaction chamber from a different portion, whereby the supply rate of the gas supplied to the reaction chamber can be decreased without change in the total amount of gas. Thus, high-frequency power is efficiently supplied to the gas to increase generation efficiency of reaction species needed for deposition, so that the deposition rate of the microcrystalline semiconductor layer and the uniformity of the film thickness within a deposition surface can be improved.

Note that when the flow rate of hydrogen is set to 0 to 5 times that of the deposition gas, an amorphous semiconductor layer can be formed. When this embodiment is employed for deposition of the amorphous semiconductor layer, the deposition rate of the amorphous semiconductor layer and the uniformity of the film thickness within a deposition surface can also be improved.

Although the structure of a capacitive coupling (parallel plate) deposition apparatus is described in this embodiment, an embodiment of the present invention is not limited thereto. Another structure such as an inductively coupled type structure may be employed as long as the structure can generate glow discharge plasma in the reaction chamber 100 by supplying high-frequency power.

Embodiment 2

An example where a method for supplying a rare gas is devised will be described in this embodiment. Therefore, part of this embodiment can be performed in a manner similar to that of Embodiment 1; thus, repetitive description of the same portions as or portions having functions similar to those in Embodiment 1 and steps for forming such portions will be omitted.

Figure 2:
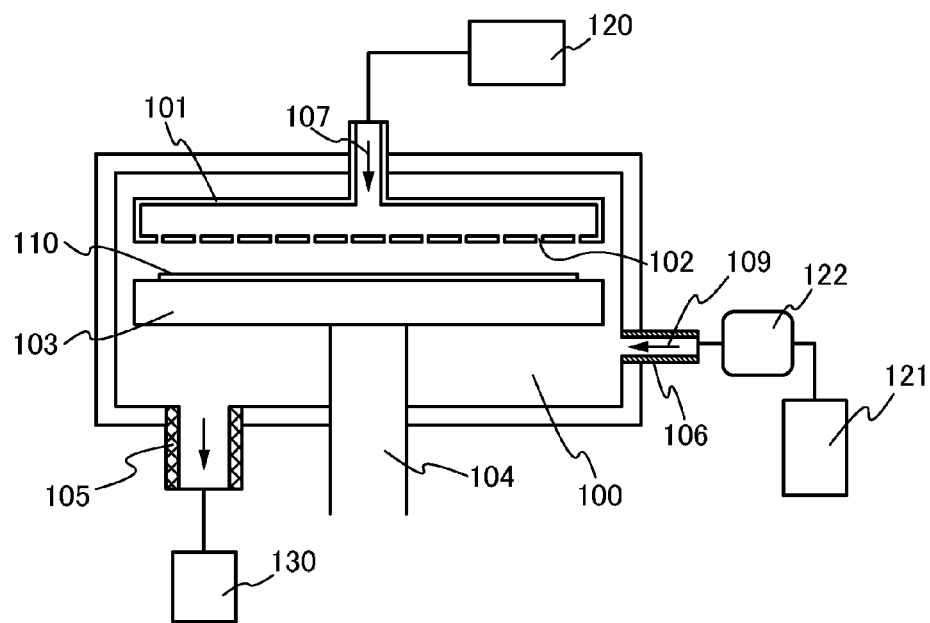
FIG. 2 illustrates a reaction chamber of a plasma CVD apparatus.
Figure 3:
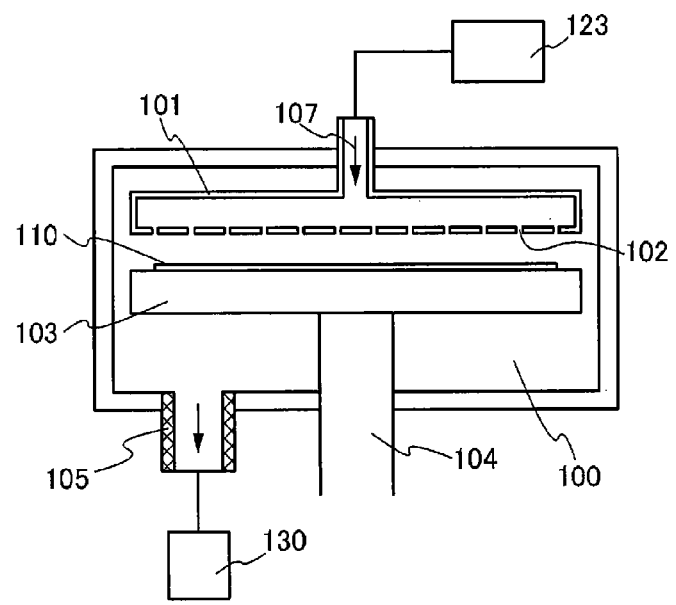
FIG. 3 illustrates a reaction chamber of a conventional plasma CVD apparatus.

This embodiment is described with reference to FIG. 2. An excitation unit 122 is connected between the supply tube 106 and the gas supply portion 121 in this embodiment. A gas 109 is excited by the excitation unit 122 before being supplied from the gas supply portion 121 to the reaction chamber. As the gas 109, a rare gas which is excited by the excitation unit 122 can be used. For example, argon (Ar) which is excited by the excitation unit 122 can be used.

First, similarly to Embodiment 1, the substrate 110 is provided over the second electrode 103 and is heated. Next, the gas 107 containing a deposition gas and hydrogen is supplied from the hollow portion of the first electrode 101 to the reaction chamber through the holes 102.

Subsequently, the gas 109 is supplied from the supply tube 106 to the reaction chamber 100. The gas 109 is a gas excited by the excitation unit 122. As the excitation unit, an inductively coupled plasma (ICP) method, a capacitively coupled plasma (CCP) method, an electron cyclotron resonance (ECR) method, or the like can be used.

Then, high-frequency power is supplied to the first electrode 101 to generate plasma between the first electrode 101 and the second electrode 103, whereby a microcrystalline semiconductor layer is deposited over the substrate 110.

When high-frequency power which is supplied to the first electrode is increased, the deposition rate can be increased to some extent. On the other hand, the microcrystalline semiconductor layer which is to be deposited is easily damaged. According to this embodiment, a deposition gas and hydrogen, and a rare gas are separately excited, whereby the deposition rate and the uniformity of the film thickness within a deposition surface can be improved while damage to the microcrystalline semiconductor layer can be suppressed.

Embodiment 3

In this embodiment, a structure of a thin film transistor having a microcrystalline semiconductor layer formed using the method described in Embodiment 1 or 2 is described with reference to FIGS. 4A to 4C.

A microcrystalline semiconductor layer formed using the method described in Embodiment 1 or 2 can be used as a channel formation region in a thin film transistor. Although the microcrystalline semiconductor layer can be used in both a bottom gate thin film transistor and a top gate thin film transistor, the microcrystalline semiconductor layer can improve characteristics of the bottom gate thin film transistor particularly. Here, a typical structure of the bottom gate thin film transistor is described with reference to FIGS. 4A to 4C.

Figure 4A:
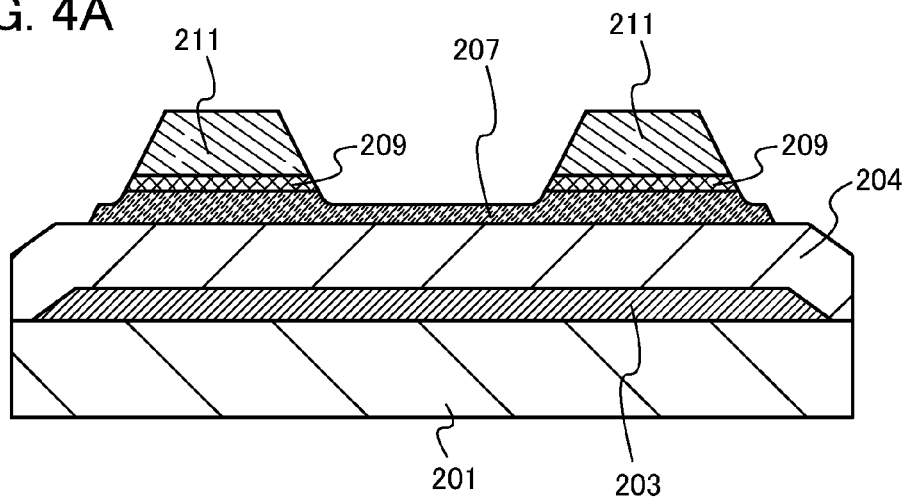
FIGS. 4A to 4C each illustrate an example of a structure of a thin film transistor.

A thin film transistor illustrated in FIG. 4A is a channel etched thin film transistor. A gate electrode 203 is formed over a substrate 201, and a gate insulating layer 204 is formed to cover the substrate 201 and the gate electrode 203. A microcrystalline semiconductor layer 207 is formed over the gate insulating layer 204. A pair of impurity semiconductor layers 209 is formed over the microcrystalline semiconductor layer 207. A pair of wirings 211 is formed to be in contact with the pair of impurity semiconductor layers 209. By forming the microcrystalline semiconductor layer 207 using the method described in Embodiment 1 or 2, the channel formation region can be formed using a microcrystalline semiconductor layer having high crystallinity. Therefore, on current and field-effect mobility of the thin film transistor can be increased. Further, crystal grains in the microcrystalline semiconductor layer are adjacent to each other and the contact area between the crystal grains is large, so that carriers in the channel formation region can easily move; thus, on current and field-effect mobility of the thin film transistor can be increased.

As the substrate 201, in addition to a glass substrate and a ceramic substrate, a plastic substrate or the like that has high heat resistance enough to withstand a process temperature in this manufacturing process can be used. In the case where the substrate does not need a light-transmitting property, a metal substrate, such as a stainless steel alloy substrate, provided with an insulating layer on its surface may be used. As a glass substrate, an alkali-free glass substrate formed using barium borosilicate glass, aluminoborosilicate glass, aluminosilicate glass, or the like may be used. Alternatively, a quartz substrate, a sapphire substrate, or the like can be used. Further, as the substrate 201, a glass substrate with any of the following sizes can be used: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2950 mm×3400 mm).

The gate electrode 203 can be formed with a single layer or a stacked layer using a metal material such as molybdenum, titanium, chromium, tantalum, tungsten, aluminum, copper, neodymium, or scandium or an alloy material which contains any of these metal materials as its main component. Alternatively, a semiconductor layer typified by polycrystalline silicon doped with an impurity element such as phosphorus, or an AgPdCu alloy may be used.

As a two-layer structure for the gate electrode 203, a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked is preferable. As a three-layer structure for the gate electrode 203, a stack structure of a tungsten film or a tungsten nitride film, a layer of an alloy of aluminum and silicon or an alloy of aluminum and titanium, and a titanium nitride film or a titanium film is preferable. When a metal film functioning as a barrier film is stacked over a film with low electric resistance, electric resistance can be low and diffusion of a metal element from the metal film into the semiconductor layer can be prevented.

In order to improve adhesion between the gate electrode 203 and the substrate 201, a film of a nitride of any of the aforementioned metal materials may be provided between the substrate 201 and the gate electrode 203.

The gate insulating layer 204 can be formed with a single layer or a stacked layer using any of a silicon oxide film, a silicon nitride film, a silicon oxynitride film, and a silicon nitride oxide film.

In this specification, silicon oxynitride contains more oxygen than nitrogen, and in the case where measurements are performed using Rutherford backscattering spectrometry (RBS) and hydrogen forward scattering (HFS), silicon oxynitride preferably contains oxygen, nitrogen, silicon, and hydrogen as composition ranging from 50 atomic % to 70 atomic %, 0.5 atomic % to 15 atomic %, 25 atomic % to 35 atomic %, and 0.1 atomic % to 10 atomic %, respectively. Further, silicon nitride oxide contains more nitrogen than oxygen, and in the case where measurements are conducted using RBS and HFS, silicon nitride oxide preferably contains oxygen, nitrogen, silicon, and hydrogen as composition ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

The microcrystalline semiconductor layer 207 is typically formed using a microcrystalline silicon film, a microcrystalline silicon germanium film, a microcrystalline germanium film, or the like. Alternatively, a microcrystalline silicon film containing phosphorus, arsenic, or antimony, a microcrystalline silicon germanium film containing phosphorus, arsenic, or antimony, a microcrystalline germanium film containing phosphorus, arsenic, or antimony, or the like may be used. Note that boron can be added to the microcrystalline semiconductor layer 207 in order to control a threshold voltage of the thin film transistor.

A microcrystalline semiconductor included in the microcrystalline semiconductor layer is a semiconductor having a crystal structure (including a single crystal and a polycrystal). A microcrystalline semiconductor is a semiconductor having a third state that is stable in terms of free energy and is a crystalline semiconductor having short-range order and lattice distortion, in which columnar or projected crystals having a grain size of 2 nm to 200 nm inclusive, preferably, 10 nm to 80 nm inclusive, more preferably, 20 nm to 50 nm inclusive have grown in a normal direction with respect to a substrate surface. Therefore, a crystal grain boundary is formed at the interface of the columnar or projected crystals in some cases.

Microcrystalline silicon which is a typical example of the microcrystalline semiconductor has a peak of Raman spectrum which is shifted to a lower wave number than 520 cm$^{-1}$ that represents single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline semiconductor may contain hydrogen or halogen of at least 1 atomic % or more to terminate a dangling bond. Moreover, a rare gas element such as helium, argon, krypton, or neon may be contained to further promote lattice distortion, so that stability of the microcrystalline structure is enhanced and a favorable microcrystalline semiconductor can be obtained. Such a microcrystalline semiconductor is disclosed in, for example, U.S. Pat. No. 4,409,134.

The concentrations of oxygen and nitrogen contained in the microcrystalline semiconductor layer which are measured by secondary ion mass spectrometry are set to less than $1\times10^{18}$ atoms/cm$^3$, which is preferable because the crystallinity of the microcrystalline semiconductor layer 207 can be increased.

In the case of an n-channel thin film transistor, the impurity semiconductor layer 209 is formed using amorphous silicon to which phosphorus is added or microcrystalline silicon to which phosphorus is added. In the case of a p-channel thin film transistor, the impurity semiconductor layer 209 is formed using amorphous silicon to which boron is added or microcrystalline silicon to which boron is added.

The wirings 211 can be formed as a single layer or a stacked layer using any of aluminum, copper, titanium, neodymium, scandium, molybdenum, chromium, tantalum, tungsten, and the like. Alternatively, an aluminum alloy to which an element for preventing a hillock is added (e.g., an aluminum-neodymium alloy which can be used for the gate electrode 203) may be used. The wirings 211 may have a stack structure in which a film that is in contact with the impurity semiconductor layer 209 is formed using titanium, tantalum, molybdenum, or tungsten, or nitride of any of these elements and aluminum or an aluminum alloy is formed thereover. Furthermore, a stacked layer structure may also be employed in which upper and lower surfaces of aluminum or an aluminum alloy may each be covered with titanium, tantalum, molybdenum, tungsten, or nitride of any of these elements.

Figure 4B:
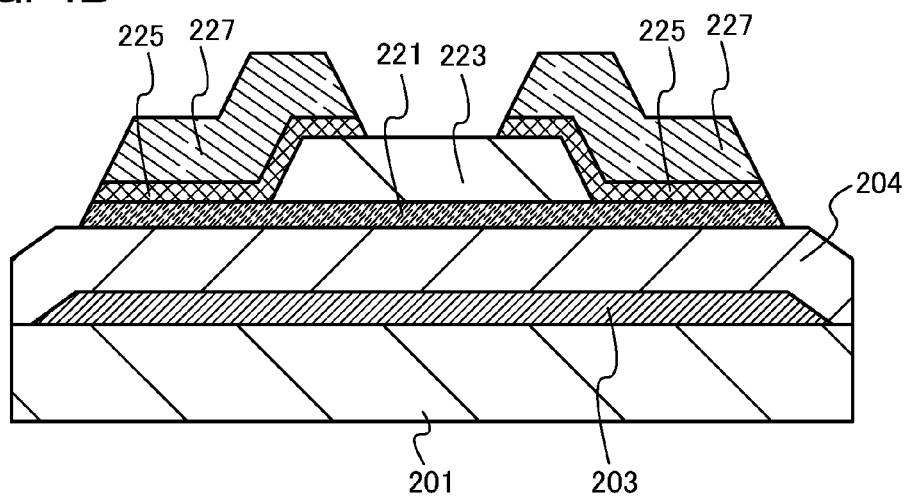

A thin film transistor illustrated in FIG. 4B is a channel stop thin film transistor. The gate electrode 203 is formed over the substrate 201, and the gate insulating layer 204 is formed to cover the substrate 201 and the gate electrode 203. A microcrystalline semiconductor layer 221 is formed over the gate insulating layer 204. A channel protective layer 223 is formed over the microcrystalline semiconductor layer 221. A pair of impurity semiconductor layers 225 is formed over the microcrystalline semiconductor layer 221 and the channel protective layer 223. A pair of wirings 227 is formed to be in contact with the pair of impurity semiconductor layers 225. By forming the microcrystalline semiconductor layer 221 using the method described in Embodiment 1 or 2, the channel formation region can be formed using a microcrystalline semiconductor layer having high crystallinity. Therefore, on current and field-effect mobility of the thin film transistor can be increased. Further, crystal grains in the microcrystalline semiconductor layer are adjacent to each other and the contact area between the crystal grains is large, so that carriers in the channel formation region can easily move; thus, on current and field-effect mobility of the thin film transistor can be increased.

The channel protective layer 223 can be formed in a manner similar to that of the gate insulating layer 204. Alternatively, polyimide, an epoxy resin, an acrylic resin, or another organic insulating layer can be used to form the channel protective layer 223.

The pair of impurity semiconductor layers 225 can be formed using a material and a structure which are similar to those of the pair of impurity semiconductor layers 209 illustrated in FIG. 4A.

The wirings 227 can be formed using a material and a structure which are similar to those of the pair of wirings 211 illustrated in FIG. 4A.

A channel protective thin film transistor is formed using the microcrystalline semiconductor layer described in Embodiment 1 or 2 for a channel formation region and includes the channel protective layer, so that on current and field-effect mobility of the thin film transistor can be increased while off current can be reduced.

Figure 4C:
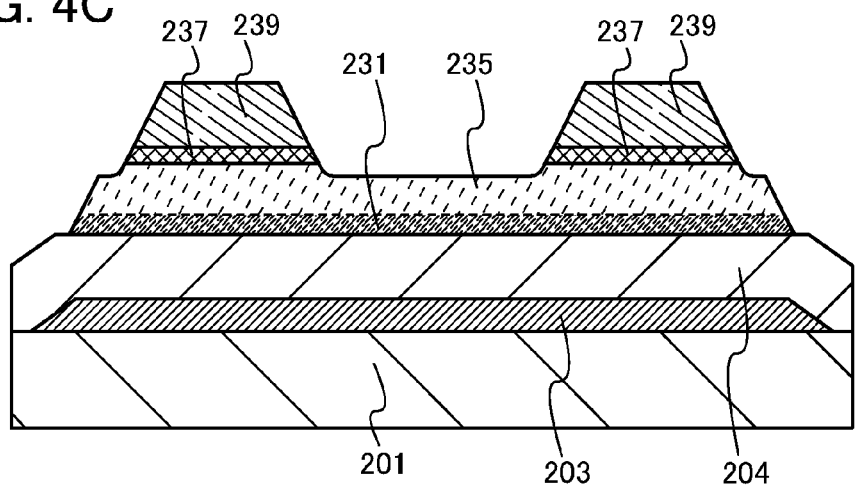

A thin film transistor illustrated in FIG. 4C is a channel etched thin film transistor and includes an amorphous semiconductor layer between a microcrystalline semiconductor layer 231 and a pair of impurity semiconductor layers 237, which is different from the structures of FIGS. 4A and 4B.

The gate electrode 203 is formed over the substrate 201, and the gate insulating layer 204 is formed to cover the substrate 201 and the gate electrode 203. The microcrystalline semiconductor layer 231 is formed over the gate insulating layer 204. An amorphous semiconductor layer 235 is formed over the microcrystalline semiconductor layer 231. The pair of impurity semiconductor layers 237 is formed over the amorphous semiconductor layer 235. A pair of wirings 239 is formed to be in contact with the pair of impurity semiconductor layers 237. By forming the microcrystalline semiconductor layer 231 using the method described in Embodiment 1 or 2, the channel formation region can be formed using a microcrystalline semiconductor layer having high crystallinity. Therefore, on current and field-effect mobility of the thin film transistor can be increased. Further, crystal grains in the microcrystalline semiconductor layer are adjacent to each other and the contact area between the crystal grains is large, so that carriers in the channel formation region can easily move; thus, on current and field-effect mobility of the thin film transistor can be increased.

The amorphous semiconductor layer 235 can be formed using amorphous silicon, amorphous silicon containing nitrogen, amorphous silicon containing chlorine, or the like. The amorphous semiconductor layer 235 is provided between the microcrystalline semiconductor layer 231 and the pair of impurity semiconductor layers 237, so that off current of the thin film transistor can be reduced.

As the amorphous semiconductor layer 235, a semiconductor layer having a peak region of a spectrum obtained by low-temperature photoluminescence spectroscopy of 1.31 eV to 1.39 eV inclusive can be used. As the amorphous semiconductor layer 235, a semiconductor layer which has a low energy at an Urbach edge measured by a constant photocurrent method (CPM) or photoluminescence spectroscopy and a small amount of absorption spectra of defects can be formed. That is, as compared with the conventional amorphous semiconductor, the amorphous semiconductor is a well-ordered semiconductor which has fewer defects and whose tail of a level at a band edge in the valence band is steep. Since the tail of the level at the band edge in the valence band is steep in the amorphous semiconductor layer, the band gap gets wider, and tunneling current does not easily flow. Thus, when the amorphous semiconductor layer is provided on the back channel side, on current and field-effect mobility can be increased while off current of the thin film transistor can reduced.

The pair of impurity semiconductor layers 237 can be formed using a material and a structure which are similar to those of the pair of impurity semiconductor layers 209 illustrated in FIG. 4A.

The wirings 239 can be formed using a material and a structure which are similar to those of the pair of wirings 211 illustrated in FIG. 4A.

The thin film transistor illustrated in FIG. 4C is formed using the microcrystalline semiconductor layer described in Embodiment 1 or 2 as a channel formation region and includes the amorphous semiconductor layer 235, so that on current and field-effect mobility of the thin film transistor can be increased while off current is reduced.

Embodiment 4

In this embodiment, a method for manufacturing the thin film transistor illustrated in FIG. 4C which is described in Embodiment 3 will be described with reference to FIGS. 5A to 5C and FIGS. 6A to 6C.

Here, it is preferable that all thin film transistors formed over the same substrate have the same conductivity type because the number of manufacturing steps can be reduced. Therefore, in this embodiment, a method for manufacturing an n-channel thin film transistor is described.

Figure 5A:
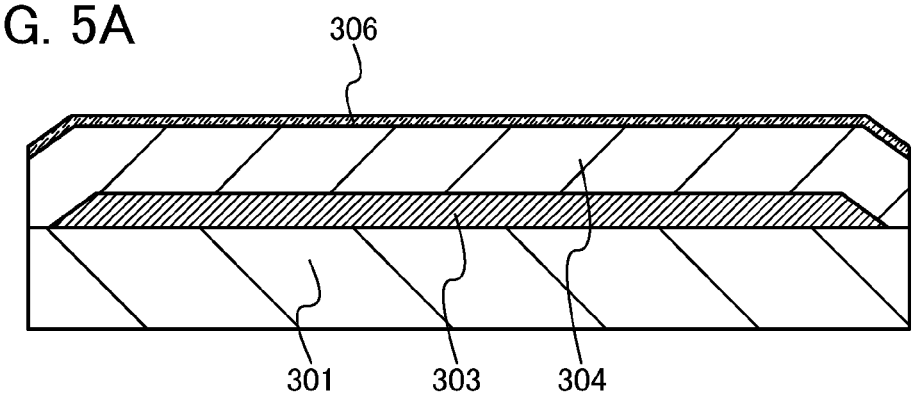
FIGS. 5A to 5C illustrate an example of a method for manufacturing a thin film transistor.

As illustrated in FIG. 5A, a gate electrode 303 is formed over a substrate 301. Then, a gate insulating layer 304 is formed to cover the gate electrode 303. After that, a first semiconductor layer 306 is formed over the gate insulating layer 304 using the method for forming a microcrystalline semiconductor layer described in Embodiment 1 or 2.

As the substrate 301, the substrate 201 described in Embodiment 3 can be used as appropriate.

The material and the structure of the gate electrode 203 described in Embodiment 3 can be employed as appropriate for the gate electrode 303.

The gate electrode 303 can be formed in such a manner that a conductive layer is formed over the substrate 301 with a sputtering method or a vacuum evaporation method, a mask is formed over the conductive layer with a photolithography method, an ink-jet method, or the like, and the conductive layer is etched using the mask. Alternatively, the gate electrode 303 can be formed by discharging a conductive nanopaste of silver, gold, copper, or the like over the substrate with an ink-jet method and baking the conductive nanopaste. Here, a conductive layer is formed over the substrate 301 and then etched using a resist mask which is formed through a first photolithography process, whereby the gate electrode 303 is formed.

Note that, in the photolithography process, a resist may be applied to the entire surface of the substrate. Alternatively, a resist may be printed with a printing method on a region where a resist mask is to be formed, and then, the resist may be exposed to light, whereby a resist can be saved and cost can be reduced. Further alternatively, instead of exposing a resist to light by using a light-exposure machine, a laser beam direct drawing apparatus may be used to expose a resist to light.

In addition, when side surfaces of the gate electrode 303 are tapered, disconnection of a semiconductor layer and a wiring film formed over the gate electrode 303 at a step portion can be reduced. In order to form the side surfaces of the gate electrode 303 to be tapered, etching may be performed while the resist mask is reduced in its size.

Through the step of forming the gate electrode 303, a gate wiring (a scan line) and a capacitor wiring can also be formed at the same time. Note that a "scan line" means a wiring which selects a pixel, while a "capacitor wiring" means a wiring which is connected to one of electrodes of a capacitor in a pixel. However, without limitation thereto, the gate electrode 303 and one or both of the gate wiring and the capacitor wiring may be formed in separate steps.

The material and the structure of the gate insulating layer 204 described in Embodiment 3 can be employed as appropriate for the gate insulating layer 304. The gate insulating layer 304 can be formed with a sputtering method, a CVD method, a coating method, a printing method, or the like as appropriate.

Further, by forming a silicon oxide film with a CVD method using an organosilane gas as an outermost surface of the gate insulating layer 304, the crystallinity of the first semiconductor layer 306 which is formed later can be improved, so that on current and field-effect mobility of the thin film transistor can be increased. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The first semiconductor layer 306 is formed with the method for forming a microcrystalline semiconductor layer described in Embodiment 1 or 2.

The thickness of the first semiconductor layer 306 is preferably 3 nm to 100 nm, more preferably, 5 nm to 50 nm. This is because when the first semiconductor layer 306 is too thin, on current of the thin film transistor is reduced. Further, when the first semiconductor layer 306 is too thick, off current of the thin film transistor is increased while the thin film transistor operates at a high temperature. The thickness of the first semiconductor layer 306 is set to 3 nm to 100 nm, preferably, 5 nm to 50 nm, whereby on current and off current of the thin film transistor can be controlled.

Figure 1B:
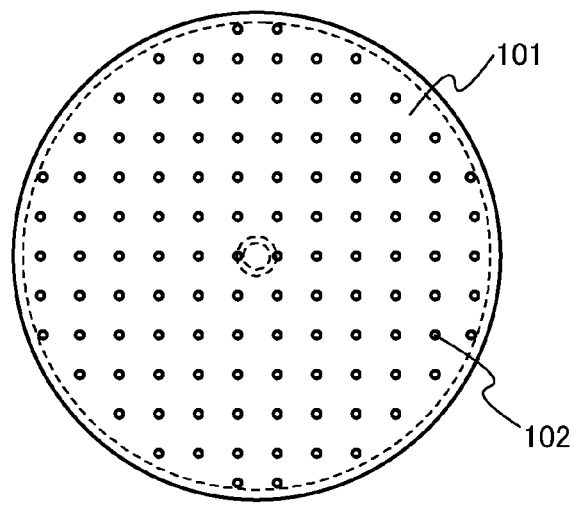

Here, for example, the first semiconductor layer 306 is formed in the plasma CVD apparatus illustrated in FIGS. 1A and 1B by glow discharge plasma while introducing hydrogen and a deposition gas containing silicon or germanium to the reaction chamber from the shower plate of the first electrode 101, and a rare gas such as helium (He), neon (Ne), argon (Ar), xenon (Xe), or krypton (Kr) to the reaction chamber from the supply tube 106. Microcrystalline silicon, microcrystalline silicon germanium, microcrystalline germanium, or the like is formed using a mixture which is obtained by diluting the deposition gas containing silicon or germanium with hydrogen whose flow rate is 10 to 2000 times, preferably, 10 to 200 times that of the deposition gas. The deposition temperature at this time is from room temperature to 300° C., preferably, 200° C. to 280° C.

Typical examples of the deposition gas containing silicon or germanium include silane ($SiH_4$), disilane ($Si_2H_6$), germane ($GeH_4$), and digermane ($Ge_2H_6$).

When the gate insulating layer 304 is formed using a silicon nitride film, in the case where the first semiconductor layer 306 is a microcrystalline semiconductor layer, an amorphous semiconductor region is likely to be formed at an early stage of deposition, so that crystallinity of the microcrystalline semiconductor layer is low and electric characteristics of the thin film transistor are poor. Therefore, when the gate insulating layer 304 is formed using a silicon nitride film, a microcrystalline semiconductor layer is preferably deposited under the low temperature condition. Typically, the low temperature condition is preferable in which the temperature for deposition of the microcrystalline semiconductor layer is 200° C. to 250° C. When the low temperature condition is employed, early nuclear generation density is increased, an amorphous component over the gate insulating layer is reduced, and crystallinity of the microcrystalline semiconductor layer is improved.

Note that before the first semiconductor layer 306 is formed, impurities in the reaction chamber of the CVD apparatus are removed by introducing the deposition gas containing silicon or germanium while exhausting the gas in the reaction chamber, so that the amount of the impurities in the gate insulating layer 304 and the first semiconductor layer 306 of the thin film transistor to be formed later can be reduced, and thus, electric characteristics of the thin film transistor can be improved.

Alternatively, before the first semiconductor layer 306 is formed, a surface of the gate insulating layer 304 may be exposed to oxygen plasma, hydrogen plasma, or the like.

Figure 5B:
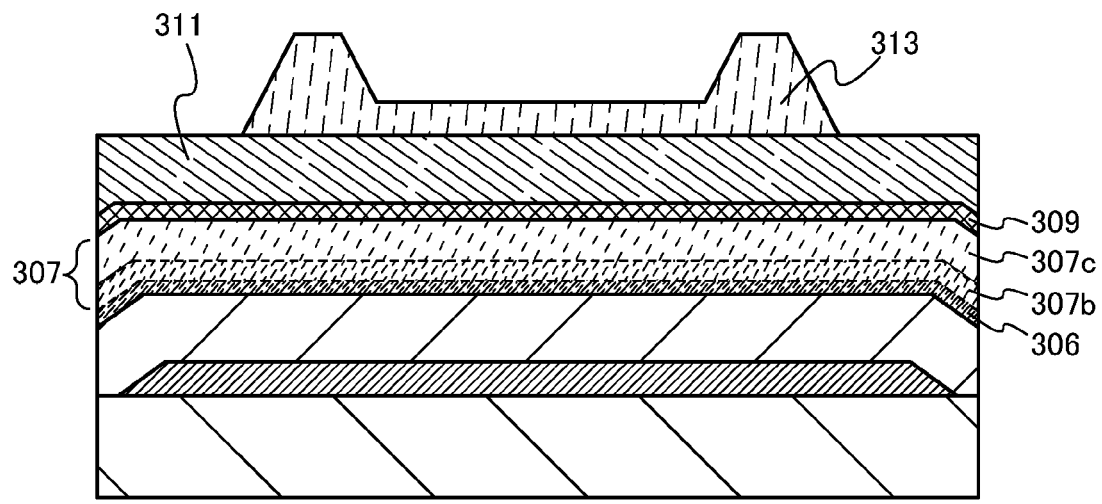
Figure 5C:
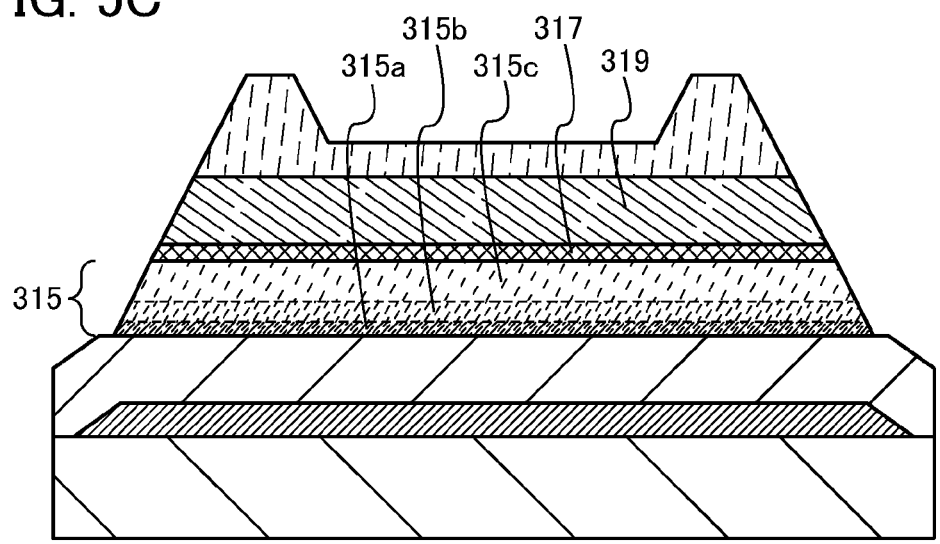

Next, as illustrated in FIG. 5B, a second semiconductor layer 307 is formed over the first semiconductor layer 306. Here, the second semiconductor layer 307 includes a mixed region 307b and a region 307c including an amorphous semiconductor.

The second semiconductor layer 307 which includes the mixed region 307b and the region 307c including an amorphous semiconductor can be formed under a condition that crystals are grown partly using the first semiconductor layer 306 as a seed crystal.

The second semiconductor layer 307 is formed by glow discharge plasma using a mixture of a deposition gas containing silicon or germanium, hydrogen, and a gas containing nitrogen. Examples of the gas containing nitrogen include ammonia, nitrogen, nitrogen fluoride, nitrogen chloride, chloroamine, and fluoroamine.

At this time, the deposition gas containing silicon or germanium and a gas containing nitrogen are used as the source gas, whereby crystal growth can be further suppressed as compared to the deposition condition of the first semiconductor layer 306. As a result, the mixed region 307b and the region 307c including an amorphous semiconductor, which is formed using a well-ordered semiconductor layer having fewer defects and a steep tail of a level at a band edge in the valence band, can be formed in the second semiconductor layer 307.

Here, a typical example of a condition for forming the second semiconductor layer 307 is as follows. The flow rate of hydrogen is 10 to 2000 times, preferably, 10 to 200 times that of the deposition gas containing silicon or germanium. Note that in a typical example of a condition for forming a normal amorphous semiconductor layer, the flow rate of hydrogen is 0 to 5 times that of the deposition gas containing silicon or germanium.

A rare gas such as helium (He), neon (Ne), argon (Ar), xenon (Xe), or krypton (Kr) is introduced to the source gas of the second semiconductor layer 307, whereby the deposition rate of the second semiconductor layer 307 can be increased.

The thickness of the second semiconductor layer 307 is preferably 50 nm to 350 nm, more preferably, 120 nm to 250 nm.

At an early stage of deposition of the second semiconductor layer 307, since a gas containing nitrogen is included in the source gas, the crystal growth is partly suppressed; therefore, while conical or pyramidal microcrystalline semiconductor regions grow, an amorphous semiconductor region filling a portion between the conical or pyramidal microcrystalline semiconductor regions is formed. A region formed in such a manner that both the microcrystalline semiconductor region and the amorphous semiconductor region coexist is referred to as the mixed region 307b. Further, crystal growth of the conical or pyramidal microcrystalline semiconductor regions is stopped, so that a region where the microcrystalline semiconductor region is not included and only the amorphous semiconductor region is included is formed. Such a region where the microcrystalline semiconductor region is not included and only the amorphous semiconductor region is included is referred to as the region 307c including an amorphous semiconductor. Note that before the conical or pyramidal microcrystalline semiconductor regions grow, a microcrystalline semiconductor layer is formed over the entire surface of the first semiconductor layer 306 using the first semiconductor layer 306 as a seed crystal in some cases.

Here, the second semiconductor layer 307 including the mixed region 307b and the region 307c including an amorphous semiconductor is formed using the source gas, in which a gas containing nitrogen is included, of the second semiconductor layer 307. Alternatively, as another method for forming the second semiconductor layer 307, the following may be performed: a surface of the first semiconductor layer 306 is exposed to a gas containing nitrogen so that nitrogen is adsorbed to the surface of the first semiconductor layer 306; and then the second semiconductor layer 307 including the mixed region 307b and the region 307c including an amorphous semiconductor is formed using a deposition gas containing silicon or germanium and hydrogen as the source gas.

Then, an impurity semiconductor layer 309 is formed over the second semiconductor layer 307. The impurity semiconductor layer 309 is formed by glow discharge plasma using a mixture of hydrogen, phosphine (diluted with hydrogen or silane), and a deposition gas containing silicon in the reaction chamber of the plasma CVD apparatus. Amorphous silicon to which phosphorus is added or microcrystalline silicon to which phosphorus is added is formed by diluting the deposition gas containing silicon with hydrogen. Note that in the case where a p-channel thin film transistor is manufactured, as the impurity semiconductor layer 309, amorphous silicon to which boron is added or microcrystalline silicon to which boron is added may be formed by glow discharge plasma, using diborane instead of phosphine.

Here, structures of the second semiconductor layer 307 which is formed between the gate insulating layer 304 and the impurity semiconductor layer 309 are described with reference to FIGS. 7A and 7B, FIG. 8, and FIGS. 9A and 9B. FIGS. 7A and 7B, FIG. 8, and FIGS. 9A and 9B are each an enlarged view between the gate insulating layer 304 and the impurity semiconductor layer 309.

Figure 7A:
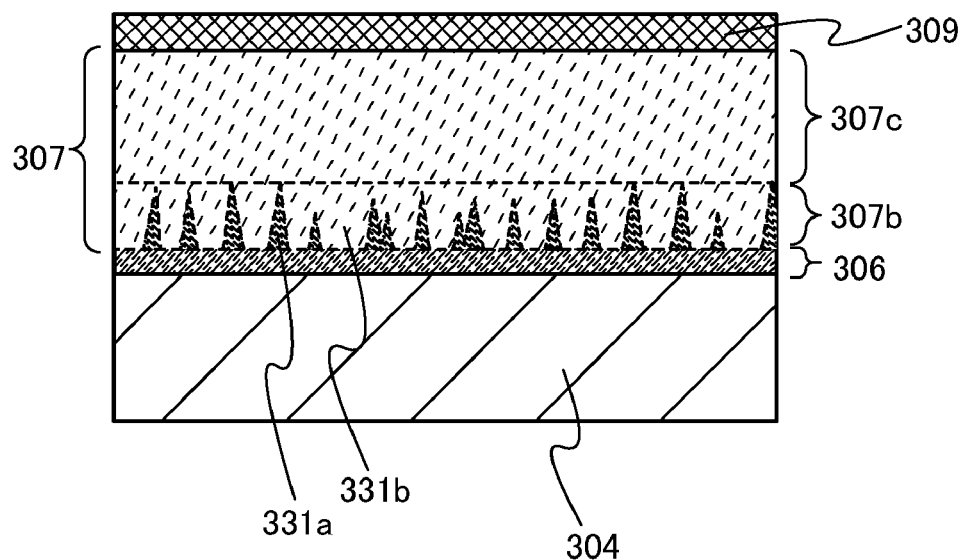
FIGS. 7A and 7B each illustrate an example of a method for manufacturing a thin film transistor.

As illustrated in FIG. 7A, the mixed region 307b includes microcrystalline semiconductor regions 331a each of which grows with a projected shape from the surface of the first semiconductor layer 306 and an amorphous semiconductor region 331b which fills a portion between the microcrystalline semiconductor regions 331a.

The microcrystalline semiconductor region 331a is a microcrystalline semiconductor having a projected (conical or pyramidal) shape whose tip is narrowed from the gate insulating layer 304 toward the region 307c including an amorphous semiconductor. Note that the microcrystalline semiconductor region 331a may be a microcrystalline semiconductor having a projected (inverted conical or inverted pyramidal) shape whose width is increased from the gate insulating layer 304 toward the region 307c including an amorphous semiconductor.

Note that the amorphous semiconductor region 331b included in the mixed region 307b may contain a semiconductor crystal grain having a grain size of 1 nm to 10 nm inclusive, preferably, 1 nm to 5 nm inclusive.

Figure 7B:
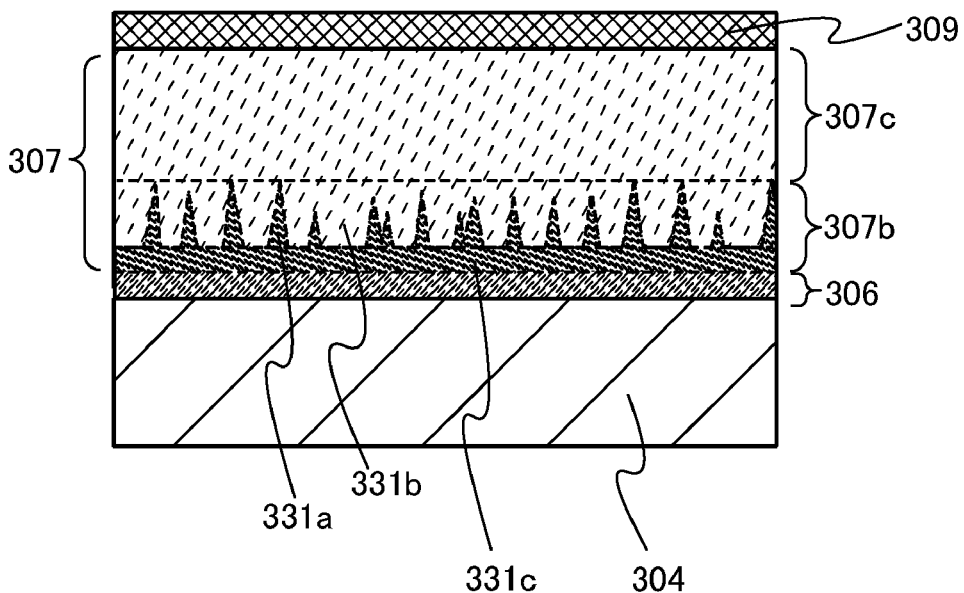

Alternatively, as illustrated in FIG. 7B, the mixed region 307b includes a microcrystalline semiconductor region 331c and the microcrystalline semiconductor region 331a which are successively formed, in some cases. The microcrystalline semiconductor region 331c is formed with a uniform thickness over the first semiconductor layer 306. The microcrystalline semiconductor region 331a has a projected (conical or pyramidal) shape whose tip is narrowed from the gate insulating layer 304 toward the region 307c including an amorphous semiconductor.

Note that in FIGS. 7A and 7B, the amorphous semiconductor region 331b included in the mixed region 307b is a semiconductor, the quality of which is substantially the same as the quality of the region 307c including an amorphous semiconductor.

According to the above, an interface between a region formed using a microcrystalline semiconductor and a region formed using an amorphous semiconductor may correspond to the interface between the microcrystalline semiconductor region 331a and the amorphous semiconductor region 331b in the mixed region 307b. Therefore, the interface between the microcrystalline semiconductor and the amorphous semiconductor can be described as uneven or zigzag in a cross-sectional view.

In the mixed region 307b, in the case where the microcrystalline semiconductor region 331a includes a semiconductor crystal grain having a projected (conical or pyramidal) shape whose tip is narrowed from the gate insulating layer 304 toward the region 307c including an amorphous semiconductor, the proportion of the microcrystalline semiconductor in the vicinity of the first semiconductor layer 306 is higher than that in the vicinity of the region 307c including an amorphous semiconductor. The microcrystalline semiconductor region 331a grows in a thickness direction from the surface of the first semiconductor layer 306. However, by adding a gas containing nitrogen to the source gas or by adding a gas containing nitrogen to the source gas and reducing the flow rate of hydrogen to silane from that under the deposition condition of the first semiconductor layer 306, crystal growth of the microcrystalline semiconductor region 331a is suppressed, the semiconductor crystal grain becomes a conical or pyramidal shape, and the amorphous semiconductor is gradually deposited. This is because the solid solubility of nitrogen in the microcrystalline semiconductor region is lower than the solid solubility of nitrogen in the amorphous semiconductor region.

The total thickness of the first semiconductor layer 306 and the mixed region 307b, that is, the distance from the interface between the gate insulating layer 304 and the first semiconductor layer 306 to the tip of the projection (projected portion) of the mixed region 307b is set to 3 nm to 410 nm inclusive, preferably, 20 nm to 100 nm inclusive. The total thickness of the first semiconductor layer 306 and the mixed region 307b is set to 3 nm to 410 nm inclusive, preferably, 20 nm to 100 nm inclusive, so that off current of the thin film transistor can be reduced.

As described above, the region 307c including an amorphous semiconductor is a semiconductor, the quality of which is substantially the same as the quality of the amorphous semiconductor region 331b, and contains nitrogen. Further, the region 307c including an amorphous semiconductor contains a semiconductor crystal grain having a grain size of 1 nm to 10 nm inclusive, preferably, 1 nm to 5 nm inclusive, in some cases. Here, the region 307c including an amorphous semiconductor is a semiconductor layer having lower energy at an Urbach edge measured by a constant photocurrent method (CPM) or photoluminescence spectroscopy and a smaller amount of absorption spectra of defects as compared to a conventional amorphous semiconductor. That is, as compared to the conventional amorphous semiconductor, the region 307c including an amorphous semiconductor is a well-ordered semiconductor which has fewer defects and a steep tail of a level at a band edge in the valence band. Since the region 307c including an amorphous semiconductor has a steep tail of a level at a band edge in the valence band, the band gap gets wider and tunneling current does not easily flow. Therefore, by providing the region 307c including an amorphous semiconductor on the back channel side, off current of the thin film transistor can be reduced. In addition, by providing the region 307c including an amorphous semiconductor, on current and field-effect mobility can be increased.

Further, a peak region of a spectrum obtained by performing low-temperature photoluminescence spectroscopy on the region 307c including an amorphous semiconductor is 1.31 eV to 1.39 eV inclusive. Note that a peak region of a spectrum obtained by performing low-temperature photoluminescence spectroscopy on a microcrystalline semiconductor layer, typically a microcrystalline silicon film, is 0.98 eV to 1.02 eV inclusive. Accordingly, the region 307c including an amorphous semiconductor is different from a microcrystalline semiconductor layer.

Note that an amorphous semiconductor included in the region 307c including an amorphous semiconductor is typically amorphous silicon.

In addition, nitrogen included in the mixed region 307b and the region 307c including an amorphous semiconductor may exist as an NH group or an $NH_2$ group, for example.

Figure 8:
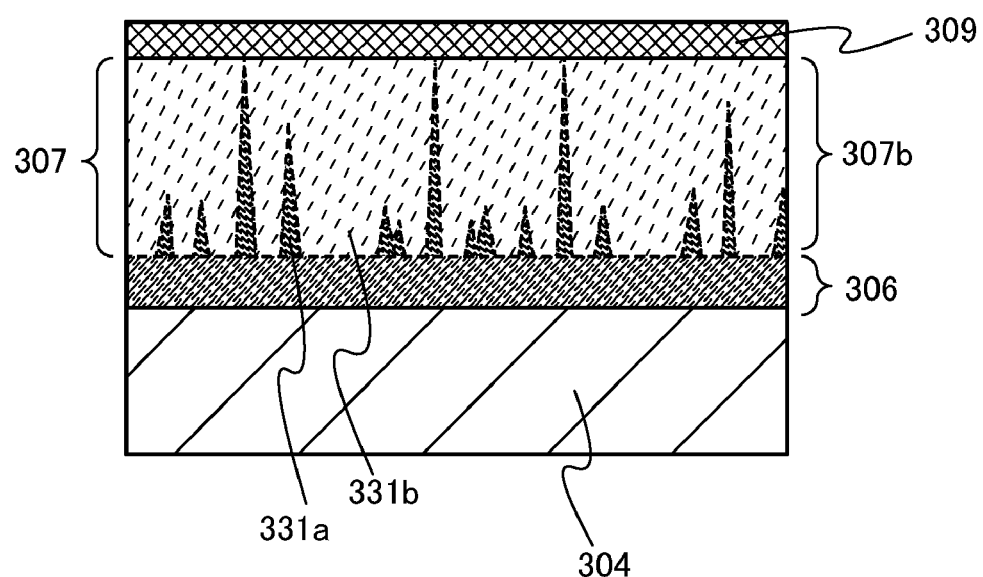
FIG. 8 illustrates an example of a method for manufacturing a thin film transistor.

Alternatively, as illustrated in FIG. 8, the mixed region 307b may entirely fill a portion between the first semiconductor layer 306 and the impurity semiconductor layer 309. In other words, the second semiconductor layer 307 may correspond to the mixed region 307b. It is preferable that, in the structure illustrated in FIG. 8, the proportion of the microcrystalline semiconductor region 331a in the mixed region 307b is lower than the structures illustrated in FIGS. 7A and 7B. Further, the proportion of the microcrystalline semiconductor region 331a in the mixed region 307b is preferably low in a region between source and drain regions, that is, a region where carriers flow. As a result, off current of the thin film transistor can be reduced. In addition, in the mixed region 307b, it is possible to reduce resistance in a vertical direction (a thickness direction), that is, resistance between the semiconductor layer and the source and drain regions, when the thin film transistor is in an on state and voltage is applied between source and drain electrodes which are formed using wirings 325, and thus on current and field-effect mobility of the thin film transistor can be increased.

Note that the mixed region 307b illustrated in FIG. 8 may include the microcrystalline semiconductor region 331c as illustrated in FIG. 7B.

Figure 9A:
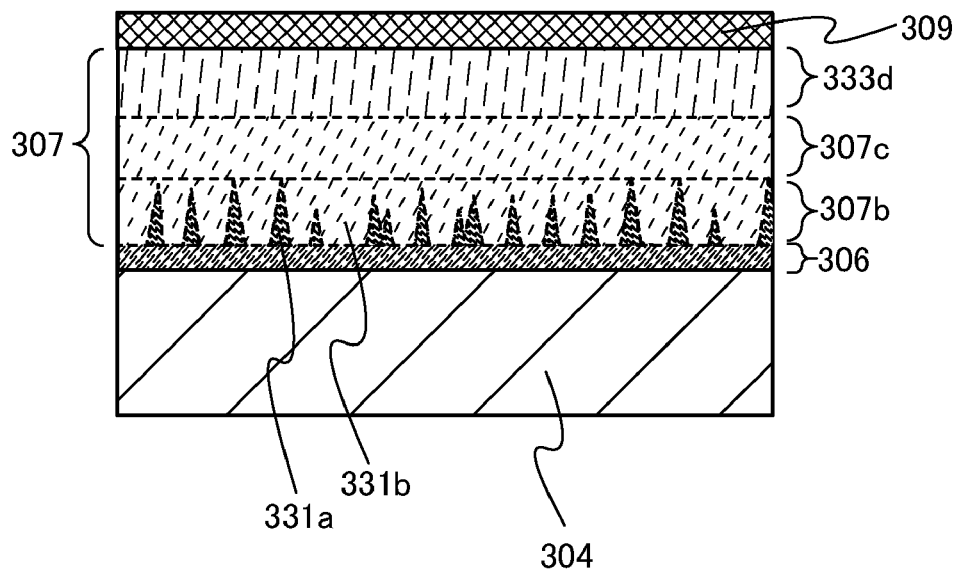
FIGS. 9A and 9B each illustrate an example of a method for manufacturing a thin film transistor.
Figure 9B:
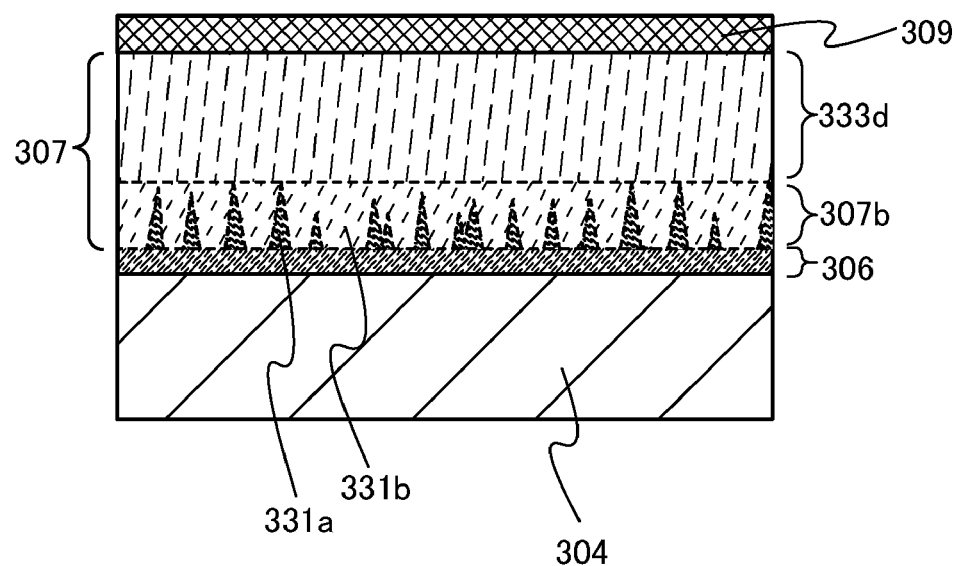

Further, a conventional amorphous semiconductor region 333d may be provided between the region 307c including an amorphous semiconductor and the impurity semiconductor layer 309 as illustrated in FIG. 9A. In other words, the second semiconductor layer 307 may include the mixed region 307b, the region 307c including an amorphous semiconductor, and the amorphous semiconductor region 333d. Alternatively, the conventional amorphous semiconductor region 333d may be provided between the mixed region 307b and the impurity semiconductor layer 309 as illustrated in FIG. 9B. In other words, the second semiconductor layer 307 may include the mixed region 307b and the amorphous semiconductor region 333d. By employing the structures illustrated in FIGS. 9A and 9B, off current of the thin film transistor can be reduced.

Note that the mixed region 307b illustrated in FIGS. 9A and 9B may include the microcrystalline semiconductor region 331c as illustrated in FIG. 7B.

Since the mixed region 307b includes the microcrystalline semiconductor region 331a having a conical or pyramidal shape, it is possible to reduce resistance in a vertical direction (a thickness direction), that is, resistance of the first semiconductor layer 306, the mixed region 307b, and the region 307c including an amorphous semiconductor, when the thin film transistor is in an on state and voltage is applied between the source and drain electrodes.

As described above, nitrogen contained in the mixed region 307b may exist typically as an NH group or an $NH_2$ group. This is because defects are reduced when an NH group or an $NH_2$ group is bonded to dangling bonds of silicon atoms at the interface between a plurality of the microcrystalline semiconductor regions included in the microcrystalline semiconductor region 331a, the interface between the microcrystalline semiconductor region 331a and the amorphous semiconductor region 331b, or the interface between the first semiconductor layer 306 and the amorphous semiconductor region 331b. Accordingly, the nitrogen concentration of the second semiconductor layer 307 is set to $1\times10^{19}$ atoms/cm$^3$ to $1\times10^{21}$ atoms/cm$^3$ inclusive, preferably, $1\times10^{20}$ atoms/cm$^3$ to $1\times10^{21}$ atoms/cm$^3$, more preferably, $2\times10^{20}$ atoms/cm$^3$ to $1\times10^{21}$ atoms/cm$^3$, and thus the dangling bonds of silicon atoms can be easily cross-linked with an NH group, so that carriers can flow easily. Alternatively, the dangling bonds of the semiconductor atoms at the aforementioned interfaces are terminated with an $NH_2$ group, so that the defect level disappears. As a result, resistance in a vertical direction (a thickness direction) is reduced when the thin film transistor is in an on state and voltage is applied between the source and drain electrodes. That is, field-effect mobility and on current of the thin film transistor are increased.

By making the oxygen concentration of the mixed region 307b lower than the nitrogen concentration of the mixed region 307b, bonds which interrupt carrier transfer due to defects at the interface between the microcrystalline semiconductor region 331a and the amorphous semiconductor region 331b or defects at the interface between semiconductor crystal grains can be reduced.

Therefore, off current of the thin film transistor can be reduced when a channel formation region is formed using the first semiconductor layer 306 and the region 307c including an amorphous semiconductor is provided between the channel formation region and the impurity semiconductor layer 309. In addition, off current can be further reduced while on current and field-effect mobility can be increased when the mixed region 307b and the region 307c including an amorphous semiconductor are provided. This is because the mixed region 307b includes the microcrystalline semiconductor region 331a having a conical or pyramidal shape and the region 307c including an amorphous semiconductor is formed using a well-ordered semiconductor layer which has few defects and a steep tail of a level at a band edge in the valence band.

Subsequently, as illustrated in FIG. 5B, a conductive layer 311 is formed over the impurity semiconductor layer 309. The conductive layer 311 can be formed using the material and the structure illustrated in Embodiment 3 as appropriate.

The conductive layer 311 is formed with a CVD method, a sputtering method, or a vacuum evaporation method. Alternatively, the conductive layer 311 may be formed by discharging a conductive nanopaste of silver, gold, copper, or the like with a screen printing method, an ink-jet method, or the like and baking the conductive nanopaste.

A resist mask 313 is formed over the conductive layer 311 by a second photolithography process. The resist mask 313 has regions with different thicknesses. Such a resist mask can be formed using a multi-tone mask. The multi-tone mask is preferably used because the number of photomasks used and the number of manufacturing steps can be reduced. In this embodiment, a resist mask formed using the multi-tone mask can be used in a process of forming patterns of the first semiconductor layer 306 and the second semiconductor layer 307 and a process of separating the source region and the drain region.

A multi-tone mask is a mask capable of light exposure with multi-level light quantity; typically, light exposure is performed with three levels of light quantity to provide an exposed region, a half-exposed region, and an unexposed region. By one light exposure and development step with the use of a multi-tone mask, a resist mask with plural thicknesses (typically, two kinds of thicknesses) can be formed. Therefore, with the use of a multi-tone mask, the number of photomasks can be reduced.

Next, with the use of the resist mask 313, the first semiconductor layer 306, the second semiconductor layer 307, the impurity semiconductor layer 309, and the conductive layer 311 are etched. Through this process, the first semiconductor layer 306, the second semiconductor layer 307, the impurity semiconductor layer 309, and the conductive layer 311 are divided for each element to form a semiconductor layer 315, an impurity semiconductor layer 317, and a conductive layer 319. Note that the semiconductor layer 315 includes a microcrystalline semiconductor layer 315a obtained by etching the first semiconductor layer 306, a mixed region 315b obtained by etching the mixed region 307b of the second semiconductor layer 307, and a region 315c including an amorphous semiconductor obtained by etching the region 307c including an amorphous semiconductor of the second semiconductor layer 307 (see FIG. 5C).

Next, the resist mask 313 is reduced in its size to form separated resist masks 323. Ashing using oxygen plasma may be performed in order to reduce the size of the resist mask. Here, ashing is performed on the resist mask 313 so that the resist mask 313 is separated over the gate electrode. Accordingly, the resist masks 323 can be formed (see FIG. 6A).

Figure 6A:
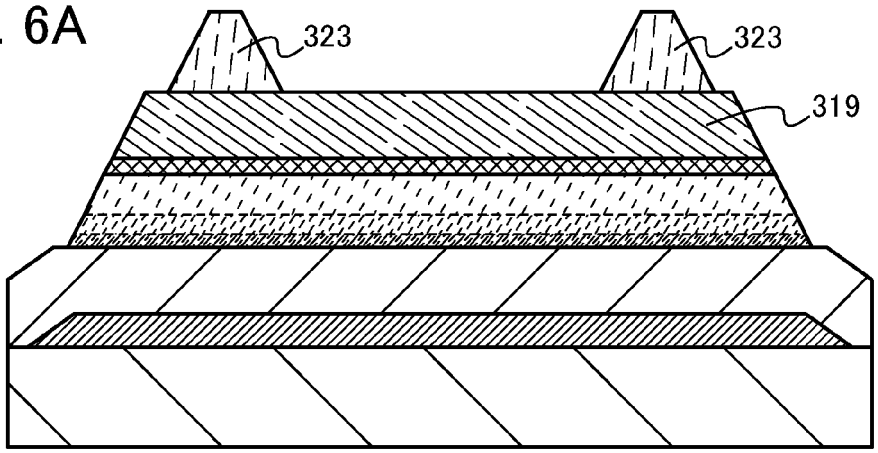
FIGS. 6A to 6C illustrate an example of a method for manufacturing a thin film transistor.
Figure 6B:
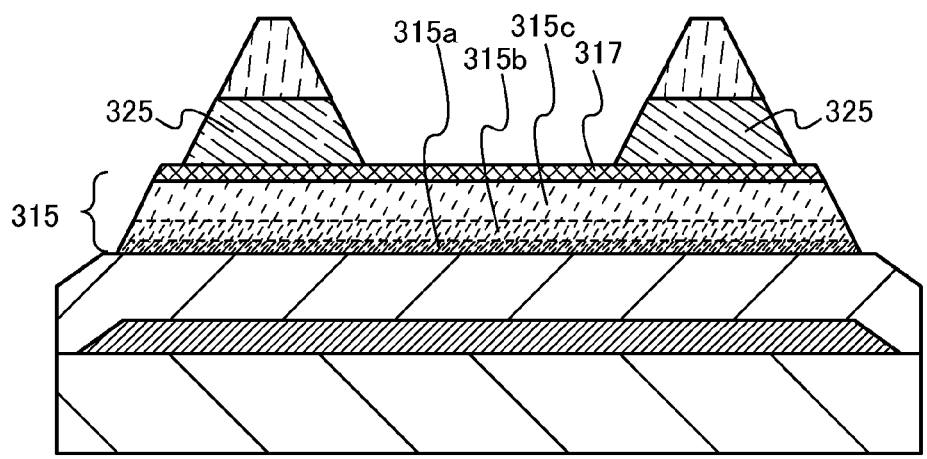
Figure 6C:
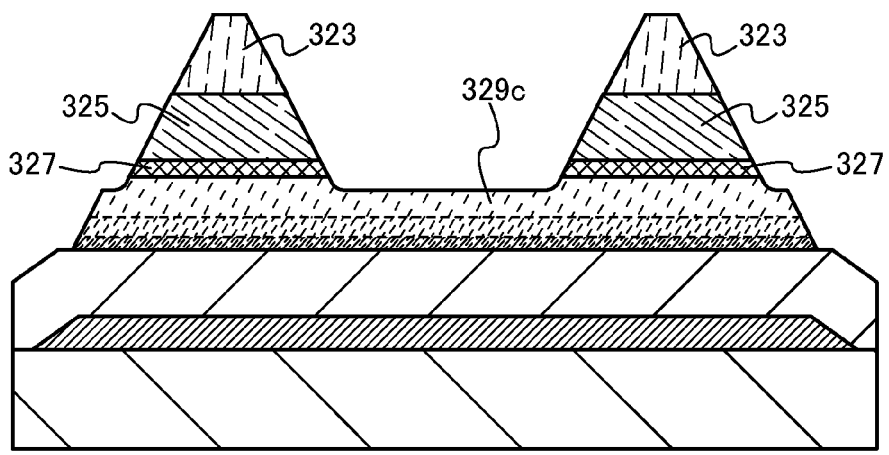

Next, the conductive layer 319 is etched using the resist masks 323, whereby the wirings 325 serving as source and drain electrodes are formed (see FIG. 6B). Here, dry etching is employed. The wirings 325 serve not only as source and drain electrodes but also as signal lines. However, without limitation thereto, a signal line may be provided separately from the source and drain electrodes.

Next, with the use of the resist masks 323 and the wirings 325 as masks, the impurity semiconductor layer 317 is etched. Here, dry etching is employed. At this time, part of the region 315c including an amorphous semiconductor which is not covered with the masks, is etched to form a region 329c including an amorphous semiconductor which has a depression on its surface. Through these steps, impurity semiconductor layers 327 serving as source and drain regions and a region 329c including an amorphous semiconductor which has a depression on its surface are formed (see FIG. 6C). After that, the resist masks 323 are removed.

Note that, here, the conductive layer 319 and the impurity semiconductor layer 317 are anisotropically etched by dry etching; thus, the side surfaces of the wirings 325 are substantially aligned with the side surfaces of the impurity semiconductor layers 327.

Note that after removal of the resist masks 323, the impurity semiconductor layer 317 and the region 315c including an amorphous semiconductor may be partly etched with the use of the wirings 325 as masks. In this etching also, the side surfaces of the wirings 325 are substantially aligned with the side surfaces of the impurity semiconductor layers 327.

Alternatively, the conductive layer 319 may be subjected to wet etching and the impurity semiconductor layer 317 and the region 315c including an amorphous semiconductor may be subjected to dry etching. In this case, the conductive layer 319 is isotropically etched by the wet etching, so that the wirings 325 having side surfaces on an inner side of the side surfaces of the resist mask 323 are formed. Then, side surfaces of the impurity semiconductor layer 327 are on the outer side of the side surfaces of the wirings 325.

Next, dry etching may be further performed after the resist masks 323 are removed. The condition of dry etching at that time is set so that a surface of an exposed portion of the region 329c including an amorphous semiconductor is not damaged and the etching rate with respect to the region 329c including an amorphous semiconductor is low. In other words, a condition which gives almost no damages to the exposed surface of the region 329c including an amorphous semiconductor and hardly reduces the thickness of the exposed portion of the region 329c including an amorphous semiconductor is applied. As an etching gas, $Cl_2$, $CF_4$, $N_2$, or the like is typically used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used.

Next, the surface of the region 329c including an amorphous semiconductor may be subjected to plasma treatment, typified by water plasma treatment, ammonia plasma treatment, nitrogen plasma treatment, or the like.

The water plasma treatment can be performed by generating plasma using a gas containing water as its main component, typified by water vapor, which is introduced to the reaction space.

As described above, after the impurity semiconductor layers 327 are formed, when dry etching is further performed under a condition which gives no damages to the region 329c including an amorphous semiconductor, an impurity such as a residue existing on the exposed surface of the region 329c including an amorphous semiconductor can be removed. By the plasma treatment, insulation between the source region and the drain region can be ensured, and thus, in a thin film transistor which is completed, off current can be reduced and a variation in electric characteristics can be reduced.

Through the above steps, a thin film transistor having preferable electric characteristics can be manufactured using fewer masks with high productivity.

Embodiment 5

In this embodiment, an element substrate and a display device including the element substrate to which the thin film transistor described in any of the above embodiments can be applied are described below. As examples of the display device, a liquid crystal display device, a light-emitting display device, electronic paper, and the like are given. The thin film transistor described in any of the above embodiments can be used for an element substrate of any other display devices. Here, a liquid crystal display device including the thin film transistor described in any of the above embodiments, typically, a vertical alignment (VA) mode liquid crystal display device is described with reference to FIG. 10 and FIG. 11.

Figure 10:
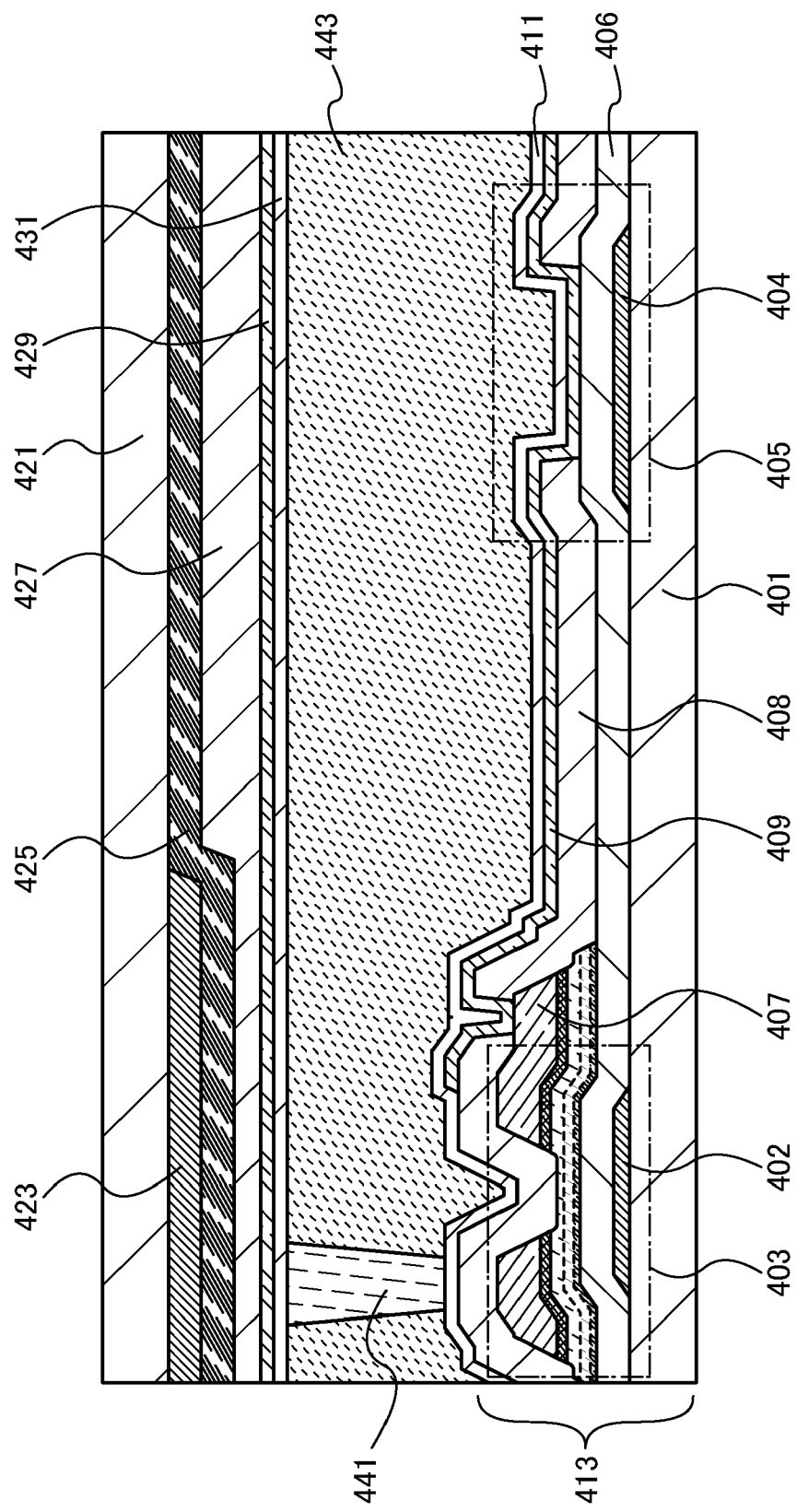
FIG. 10 illustrates an example of a display device.

FIG. 10 illustrates a cross-sectional structure of a pixel portion of a liquid crystal display device. A thin film transistor 403 formed using the method described in any of the above embodiments and a capacitor 405 are formed over a substrate 401. Further, a pixel electrode 409 is formed over an insulating layer 408 which is formed over the thin film transistor 403. A source or drain electrode 407 of the thin film transistor 403 and the pixel electrode 409 are electrically connected to each other in an opening formed in the insulating layer 408. An alignment layer 411 is formed over the pixel electrode 409.

The capacitor 405 includes a capacitor wiring 404 which is formed at the same time as a gate electrode 402 of the thin film transistor 403, a gate insulating layer 406, and the pixel electrode 409.

A stack body including components from the substrate 401 to the alignment layer 411 is referred to as an element substrate 413.

A counter substrate 421 is provided with a coloring layer 425 and a light-blocking layer 423 for blocking incidence of light into the thin film transistor 403. In addition, a planarizing layer 427 is formed on the light-blocking layer 423 and the coloring layer 425. A counter electrode 429 is formed on the planarizing layer 427, and an alignment layer 431 is formed on the counter electrode 429.

Note that the coloring layer 425 on the counter substrate 421 function as a color filter. Note that one of or both the light-blocking layer 423 and the planarizing layer 427 may be formed on the substrate 401.

The coloring layer has a function of preferentially transmitting light of a predetermined wavelength range, among light of a wavelength range of visible light. In general, a coloring layer which preferentially transmits light of a wavelength range of red light, a coloring layer which preferentially transmits light of a wavelength range of blue light, and a coloring layer which preferentially transmits light of a wavelength range of green light are combined for a color filter. However, the combination of the coloring layers is not limited to the above combination.

The substrate 401 and the counter substrate 421 are fixed to each other by a sealing material (not illustrated), and a liquid crystal layer 443 fills a space surrounded by the substrate 401, the counter substrate 421, and the sealing material. Further, a spacer 441 is provided to keep a distance between the substrate 401 and the counter substrate 421.

The pixel electrode 409, the liquid crystal layer 443, and the counter electrode 429 are overlapped with each other, whereby a liquid crystal element is formed.

Figure 11:
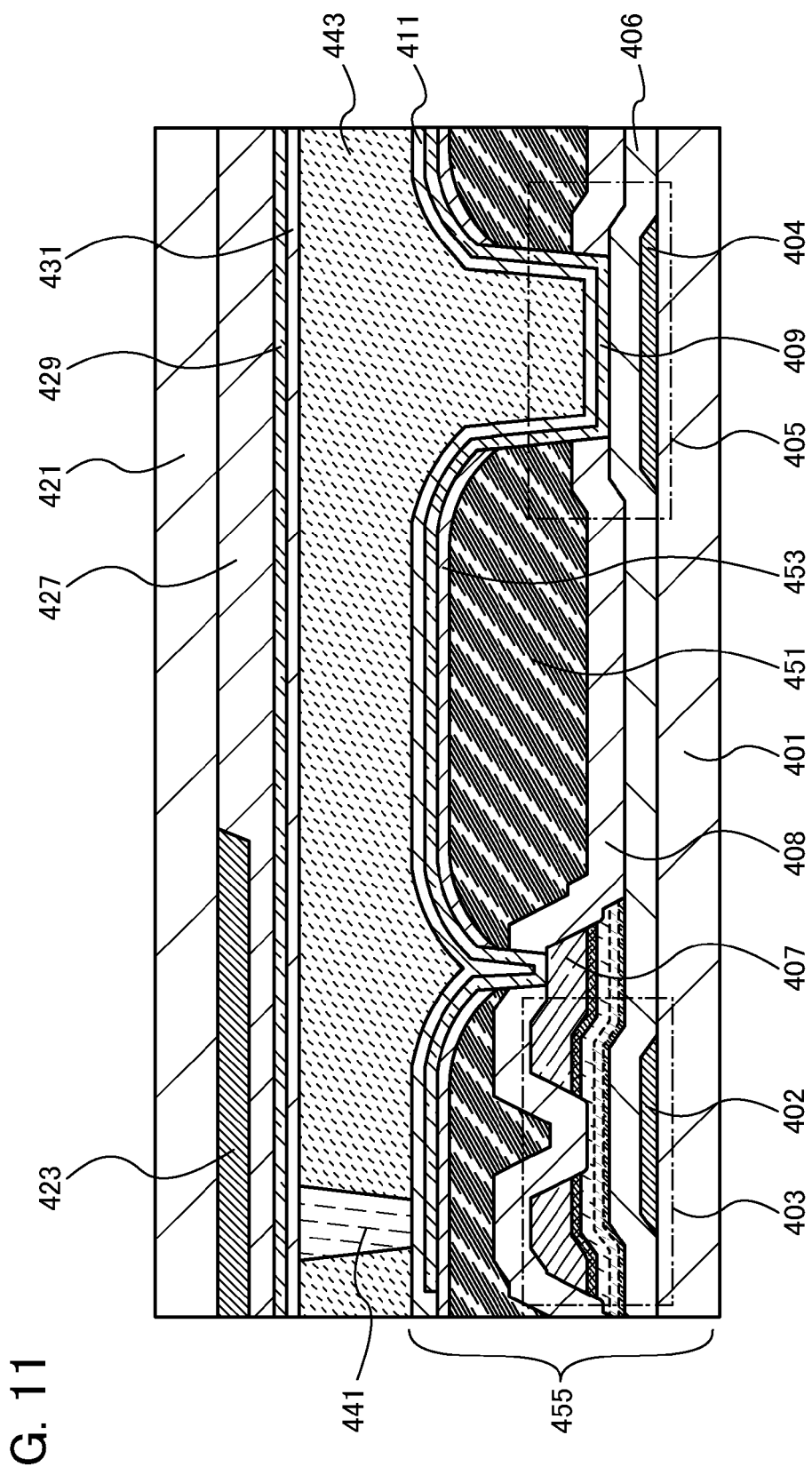
FIG. 11 illustrates an example of a display device.

FIG. 11 illustrates a liquid crystal display device different from that in FIG. 10. Here, a coloring layer is formed not on the counter substrate 421 side but over the substrate 401 provided with the thin film transistor 403.

FIG. 11 illustrates a cross-sectional structure of a pixel portion of a liquid crystal display device. The thin film transistor 403 manufactured according to any of the above embodiments and the capacitor 405 are formed over the substrate 401.

Further, a coloring layer 451 is formed over the insulating layer 408 which is formed over the thin film transistor 403. Further, a protective layer 453 is formed over the coloring layer 451 in order to prevent an impurity contained in the coloring layer 451 from being mixed into the liquid crystal layer 443. The pixel electrode 409 is formed over the coloring layer 451 and the protective layer 453. As the coloring layer 451, a film which preferentially transmits light of a predetermined wavelength range (red light, blue light, or green light) may be formed for each pixel. Further, since the coloring layer 451 also functions as a planarizing layer, uneven alignment of the liquid crystal layer 443 can be suppressed.

The source or drain electrode 407 of the thin film transistor 403 and the pixel electrode 409 are electrically connected to each other in an opening formed in the insulating layer 408, the coloring layer 451, and the protective layer 453. An alignment layer 411 is formed over the pixel electrode 409.

The capacitor 405 includes the capacitor wiring 404 which is formed at the same time as the gate electrode 402 of the thin film transistor 403, the gate insulating layer 406, and the pixel electrode 409.

A stack body including components from the substrate 401 to the alignment layer 411 is referred to as an element substrate 455.

The counter substrate 421 is provided with the light-blocking layer 423 for blocking incidence of light into the thin film transistor 403 and the planarizing layer 427 covering the light-blocking layer 423 and the counter substrate 421. The counter electrode 429 is formed on the planarizing layer 427, and the alignment layer 431 is formed on the counter electrode 429.

The pixel electrode 409, the liquid crystal layer 443, and the counter electrode 429 are overlapped with each other, whereby a liquid crystal element is formed.

Note that although the VA liquid crystal display device is described here as a liquid crystal display device, an embodiment of the present invention is not limited thereto. That is, an element substrate which is formed using the thin film transistor described in any of the above embodiments can also be applied to an FFS mode liquid crystal display device, an IPS mode liquid crystal display device, a TN mode liquid crystal display device, and other modes of liquid crystal display devices.

Since the thin film transistor with large on current, high field-effect mobility, and small off current is used as a pixel transistor in the liquid crystal display device of this embodiment, image quality (e.g., contrast) of the liquid crystal display device can be improved. Further, electric characteristics of the thin film transistor is not degraded even when the thin film transistor is downsized; therefore, by reducing the size of the thin film transistor, the aperture ratio of the liquid crystal display device can be increased. Alternatively, the area of a pixel can be reduced, so that resolution of the liquid crystal display device can be improved.

Further, in the liquid crystal display device illustrated in FIG. 11, the light-blocking layer 423 and the coloring layer 451 are not formed over the same substrate. Therefore, misalignment of a mask in formation of the coloring layer 451 can be prevented. Accordingly, the area of the light-blocking layer 423 is not necessarily increased, which can increase the aperture ratio of the pixel.

Embodiment 6

In this embodiment, an example of a light-emitting display device as one mode of the display device using the thin film transistor shown in any of the above embodiments will be described. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film-type inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film-type inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 12:
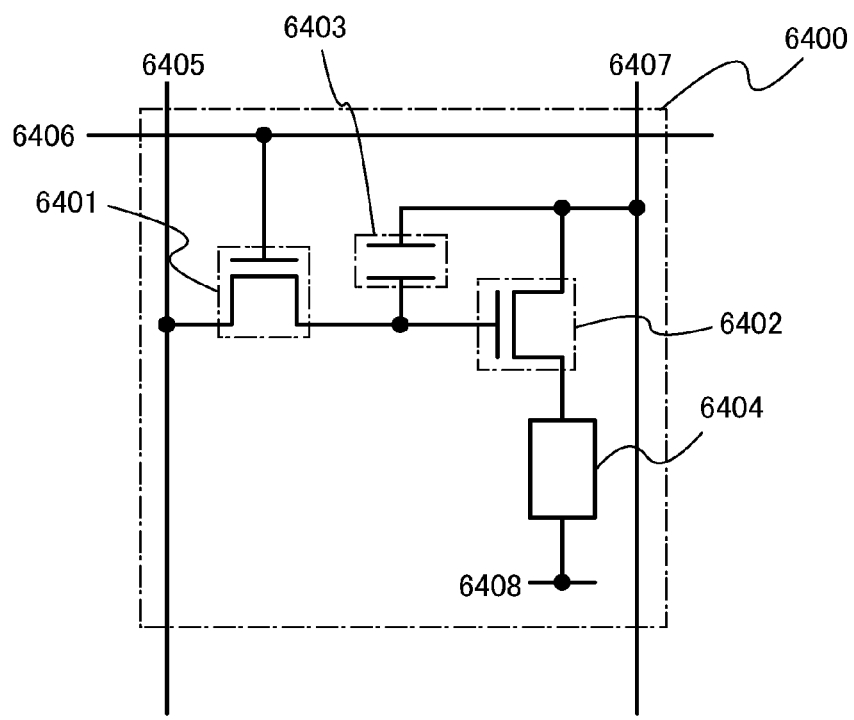
FIG. 12 illustrates an example of an equivalent circuit of a pixel of a display device.

FIG. 12 illustrates an example of a pixel structure to which digital time grayscale driving can be applied, as an example of a display device using the present invention.

A structure and operation of a pixel to which digital time grayscale driving can be applied are described. Here, one pixel includes two n-channel transistors each of which includes the microcrystalline semiconductor layer which is described in Embodiment 1 or 2 as its channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential which is lower than a high power supply potential set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power potential and the low power supply potential is higher than or equal to a forward threshold voltage of the light-emitting element 6404.

Note that gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to (voltage of the power supply line 6407+Vth of the driver transistor 6402) is applied to the signal line 6405.

In the case of performing analog grayscale driving instead of digital time grayscale driving, the same pixel structure as that in FIG. 12 can be used by changing signal input.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least a forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 12 is not limited thereto. For example, a switch, a resistor, a capacitor, a transistor, a logic circuit, or the like may be added to the pixel illustrated in FIG. 12.

Next, structures of the light-emitting element will be described with reference to FIGS. 13A to 13C. A cross-sectional structure of a pixel will be described using an n-type driving TFT as an example. Driving TFTs 7001, 7011, and 7021 used for display devices illustrated in FIGS. 13A to 13C can be formed in a manner similar to that for forming the thin film transistor described in any of the above embodiments.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light-emitting element having a top emission structure will be described with reference to FIG. 13A.

Figure 13A:
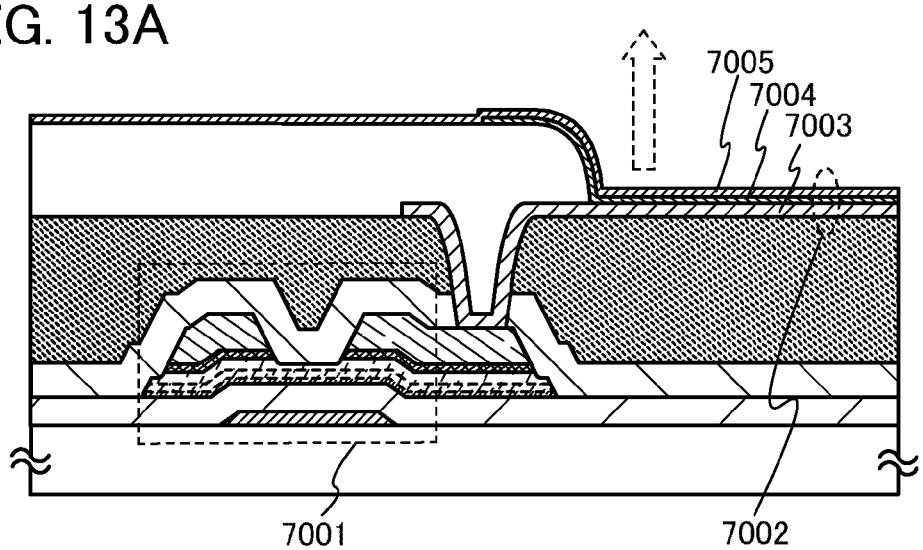
FIGS. 13A to 13C each illustrate an example of a display device.

FIG. 13A is a cross-sectional view of a pixel in the case where the driving TFT 7001 is an n-type TFT and light is emitted from a light-emitting element 7002 to an anode 7005 side. In FIG. 13A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. It is not necessary to form all of these layers. The anode 7005 is formed using a light-transmitting conductive layer such as a layer of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 13A, light is emitted from the light-emitting element 7002 to the anode 7005 side as indicated by an arrow.

Next, a light-emitting element having a bottom emission structure will be described with reference to FIG. 13B. FIG. 13B is a cross-sectional view of a pixel in the case where the driving TFT 7011 is an n-type TFT and light is emitted from a light-emitting element 7012 to a cathode 7013 side. In FIG. 13B, the cathode 7013 of the light-emitting element 7012 is formed over a light-transmitting conductive layer 7017 that is electrically connected to the driving TFT 7011, and a light-emitting layer 7014 and an anode 7015 are stacked in this order over the cathode 7013. A light-blocking layer 7016 for reflecting or blocking light may be formed to cover the anode 7015 when the anode 7015 has a light-transmitting property. For the cathode 7013, a variety of materials can be used as in the case of FIG. 13A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 13A, the light-emitting layer 7014 may be formed using either a single layer or a plurality of layers stacked. The anode 7015 is not required to transmit light, but can be formed using a light-transmitting conductive material as in the case of FIG. 13A. As the light-blocking layer 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 13B, light is emitted from the light-emitting element 7012 to the cathode 7013 side as indicated by an arrow.

Next, a light-emitting element having a dual emission structure will be described with reference to FIG. 13C. In FIG. 13C, a cathode 7023 of a light-emitting element 7022 is formed over a light-transmitting conductive layer 7027 which is electrically connected to the driving TFT 7021, and a light-emitting layer 7024 and an anode 7025 are stacked in this order over the cathode 7023. As in the case of FIG. 13A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 13A, the light-emitting layer 7024 may be formed using either a single layer or a plurality of layers stacked. The anode 7025 can be formed using a light-transmitting conductive material as in the case of FIG. 13A.

The light-emitting element 7022 corresponds to a region where the cathode 7023, the light-emitting layer 7024, and the anode 7025 overlap with one another. In the case of the pixel illustrated in FIG. 13C, light is emitted from the light-emitting element 7022 to both the anode 7025 side and the cathode 7023 side as indicated by arrows.

Note that, although the organic EL elements are described here as the light-emitting elements, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 13B:
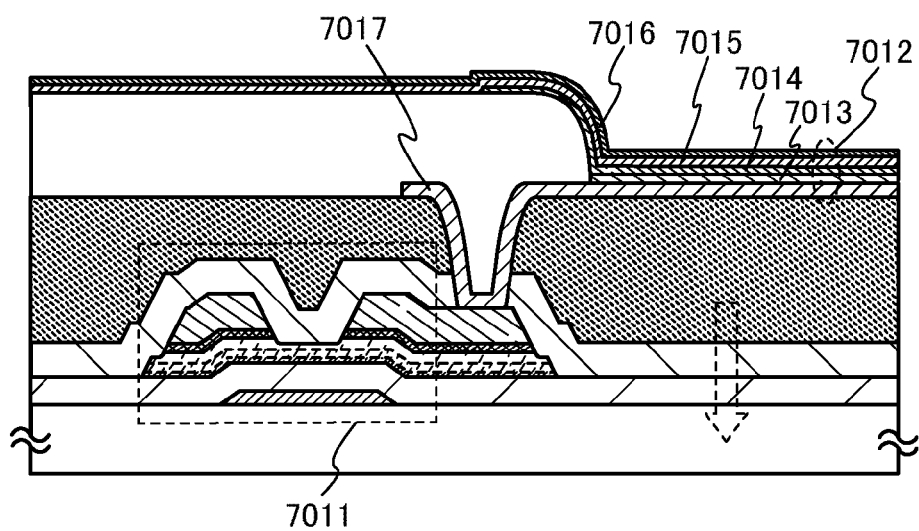
Figure 13C:
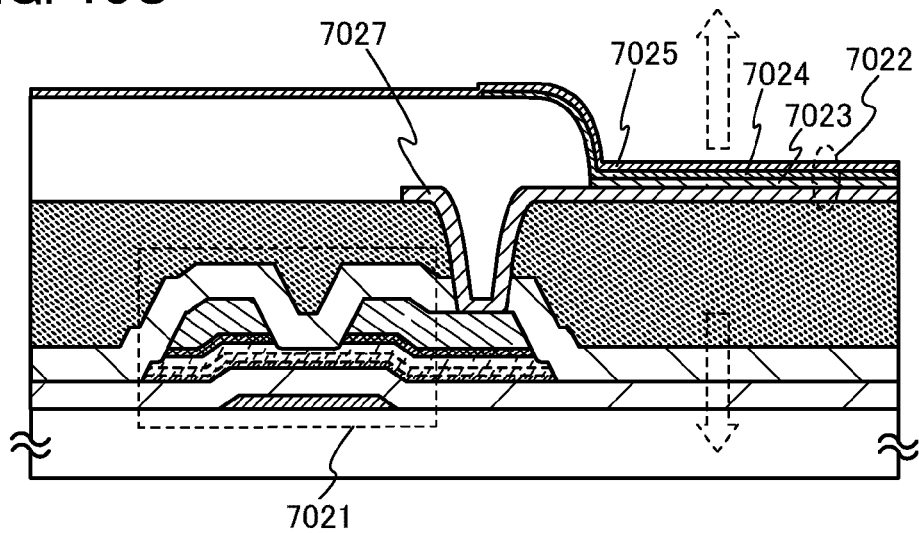

The display device described in this embodiment is not limited to the structures illustrated in FIGS. 13A to 13C and can be modified in various ways based on the spirit of techniques of the present invention.

Next, the appearance and a cross section of a light-emitting display panel (also referred to as a light-emitting panel), which is one mode of a display device including the thin film transistor shown in any of the above embodiments, will be described with reference to FIGS. 14A and 14B. FIG. 14A is a top view of a panel in which a thin film transistor and a light-emitting element formed over a first substrate are sealed between the first substrate and a second substrate with a sealant. FIG. 14B is a cross-sectional view taken along line H-I of FIG. 14A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors. In FIG. 14B, a thin film transistor 4510 included in the pixel portion 4502 and a thin film transistor 4509 included in the signal line driver circuit 4503a are illustrated.

For each of the thin film transistors 4509 and 4510, the thin film transistor in any of the above embodiments can be used. In this embodiment, the thin film transistors 4509 and 4510 are n-channel thin film transistors.

Moreover, a first electrode layer 4517 which is a pixel electrode included in a light-emitting element 4511 is electrically connected to a source electrode layer or a drain electrode layer of the thin film transistor 4510. Note that a structure of the light-emitting element 4511 is a stacked-layer structure of the first electrode layer 4517, a light-emitting layer 4512, and a second electrode layer 4513, but is not limited to the structure described in this embodiment. The structure of the light-emitting element 4511 can be changed as appropriate depending on the direction in which light is extracted from the light-emitting element 4511, or the like.

A partition 4520 is formed using an organic resin film, an inorganic insulating layer, or organic polysiloxane. It is particularly preferable that the partition 4520 be formed using a photosensitive material and an opening be formed over the first electrode layer 4517 so that a sidewall of the opening is formed as an inclined surface with continuous curvature.

The light-emitting layer 4512 may be formed with a single layer or a plurality of layers stacked.

A protective layer may be formed over the second electrode layer 4513 and the partition 4520 in order to prevent entry of oxygen, hydrogen, moisture, carbon dioxide, or the like into the light-emitting element 4511. As the protective layer, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed from the same conductive layer as the first electrode layer 4517 included in the light-emitting element 4511, and a terminal electrode 4516 is formed from the same conductive layer as the source and drain electrode layers included in the thin film transistors 4509 and 4510.

The connection terminal electrode 4515 is electrically connected to a terminal included in the FPC 4518a via an anisotropic conductive layer 4519.

The second substrate located in the direction in which light is extracted from the light-emitting element 4511 should have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be provided by mounting driver circuits formed using a single crystal semiconductor layer or polycrystalline semiconductor layer over a substrate separately prepared. In addition, only the signal line driver circuits or part thereof, or the scan line driver circuits or part thereof may be separately formed and mounted. This embodiment is not limited to the structure illustrated in FIGS. 14A and 14B.

Through this process, a highly reliable light-emitting display device (display panel) can be manufactured as a display device.

Embodiment 7

In this embodiment, an example of electronic paper will be described as one mode of a display device to which the thin film transistor described in any of the above embodiments is applied.

Figure 15:
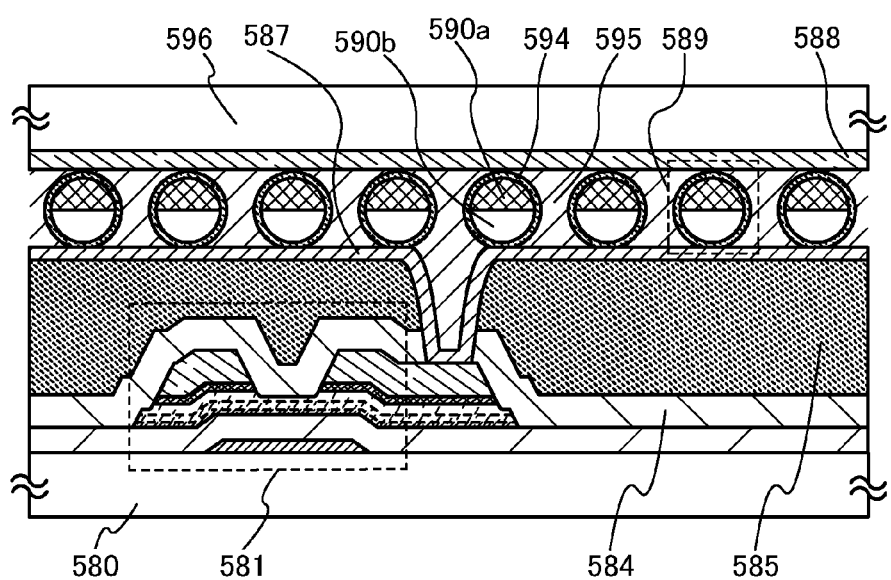
FIG. 15 illustrates an example of a display device.

FIG. 15 illustrates active matrix electronic paper as an example of a display device. As a thin film transistor 581 used in a display device, the thin film transistor described in any of the above embodiments can be used.

The electronic paper in FIG. 15 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a thin film transistor with a bottom gate structure, and a source or drain electrode layer thereof is in contact with a first electrode layer 587 in an opening formed in an insulating layer 584 and an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 filled with liquid, around the regions, are provided. A space around the spherical particles 589 is filled with a filler 595 such as a resin (see FIG. 15). In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581.

Further, instead of the twisting ball, an electrophoretic element can also be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

An electrophoretic display element utilizes a so-called dielectrophoretic effect by which a substance having a high dielectric constant moves to a high-electric field region. An electrophoretic display element does not need to use a polarizer or a counter substrate, which is required in a liquid crystal display device, and the thickness and weight of the display device can be reduced.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained with the thin film transistor described in any of the above embodiments can be used.

Note that the microparticles may be formed using a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Note that the structure described in this embodiment can be combined with any of the structures described in other embodiments as appropriate.

Embodiment 8

A display device including the thin film transistor according to any of the above embodiments can be applied to a variety of electronic devices (including an amusement machine). Examples of the electronic devices are a television device (also referred to as a television or a television receiver), a monitor of a computer or the like, electronic paper, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like. In particular, as described in Embodiments 5 and 6, the thin film transistor according to any of the above embodiments can be applied to a liquid crystal display device, a light-emitting device, an electrophoretic display device, or the like and thus can be used for a display portion of an electronic device. Specific examples will be described below.

A display device including the thin film transistor according to any of the above embodiments can be applied to electronic paper. An electronic paper can be used for electronic devices of a variety of fields as long as they can display data. For example, electronic paper can be applied to an electronic book (e-book) device, a poster, an advertisement in a vehicle such as a train, displays of various cards such as a credit card, and the like. Examples of such electronic devices are illustrated in FIGS. 16A and 16B and FIGS. 17A to 17D.

Figure 16A:
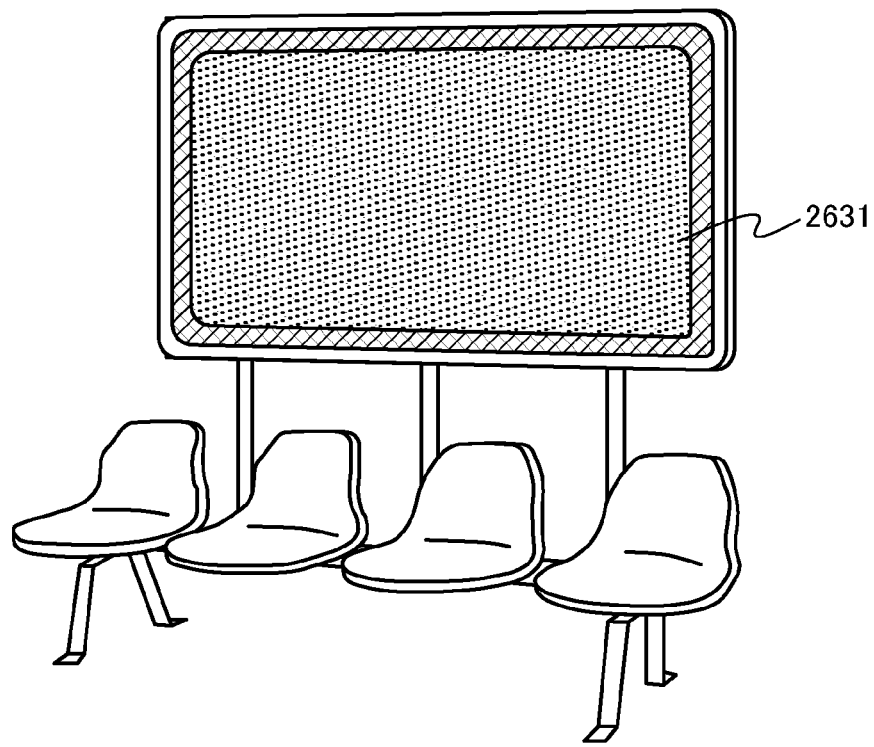
FIGS. 16A and 16B each illustrate an example of a display device.

FIG. 16A illustrates a poster 2631 using electronic paper. In the case where an advertising medium is printed paper, the advertisement is replaced by hands; however, by using electronic paper, the advertising display can be changed in a short time. Furthermore, stable images can be obtained without display defects. Note that the poster may have a structure capable of wirelessly transmitting and receiving data.

Figure 16B:
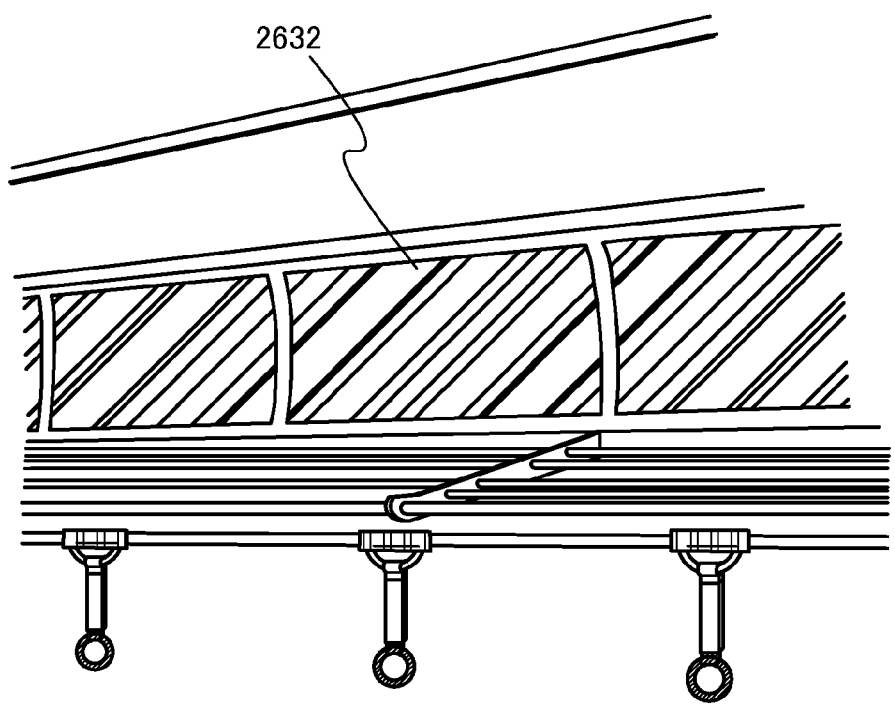

FIG. 16B illustrates an advertisement 2632 in a vehicle such as a train. In the case where an advertising medium is printed paper, the advertisement is replaced by hands; however, by using electronic paper, the advertising display can be changed in a short time with less manpower. Furthermore, stable images can be obtained without display defects. Note that the advertisement in a vehicle may have a structure capable of wirelessly transmitting and receiving data.

Figure 17A:
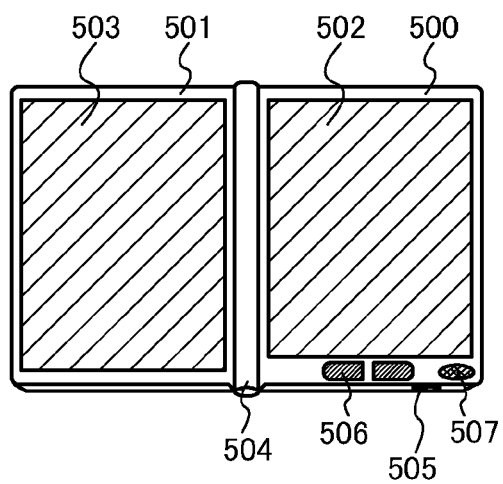
FIGS. 17A to 17D each illustrate an example of an electronic device.

FIG. 17A illustrates an example of an electronic book device. For example, the electronic book device includes two housings, a housing 500 and a housing 501. The housing 500 and the housing 501 are combined with a hinge 504 so that the electronic book device can be opened and closed. With such a structure, the electronic book device can operate like a paper book.

A display portion 502 and a display portion 503 are incorporated in the housing 500 and the housing 501, respectively. The display portion 502 and the display portion 503 may be configured to display one image or different images. In the case where the display portion 502 and the display portion 503 display different images, for example, a display portion on the right side (the display portion 502 in FIG. 17A) can display text and a display portion on the left side (the display portion 503 in FIG. 17A) can display graphics.

FIG. 17A illustrates an example in which the housing 500 is provided with an operation portion and the like. For example, the housing 500 is provided with a power source 505, an operation key 506, a speaker 507, and the like. With the operation key 506, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book device illustrated in FIG. 17A may have a function of an electronic dictionary.

The electronic book device illustrated in FIG. 17A may transmit and receive data wirelessly. Through wireless communication, desired book data or the like can be purchased and downloaded from an electronic book server.

Figure 17B:
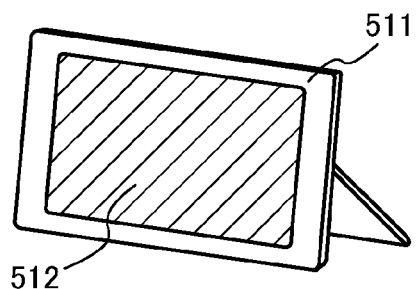

FIG. 17B illustrates an example of the digital photo frame. For example, in the digital photo frame of FIG. 17B, a display portion 512 is incorporated in a housing 511. Various images can be displayed in the display portion 512. For example, the display portion 512 can display data of an image shot by a digital camera or the like to function as a normal photo frame.

Note that the digital photo frame illustrated in FIG. 17B may be provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a storage medium having image data taken with a digital camera is inserted into the storage medium insertion portion of the digital photo frame and the image data is imported, whereby the imported image data can be displayed on the display portion 512.

Further, the digital photo frame illustrated in FIG. 17B may transmit and receive data wirelessly. The structure may be employed in which desired image data is transferred wirelessly and displayed.

Figure 17C:
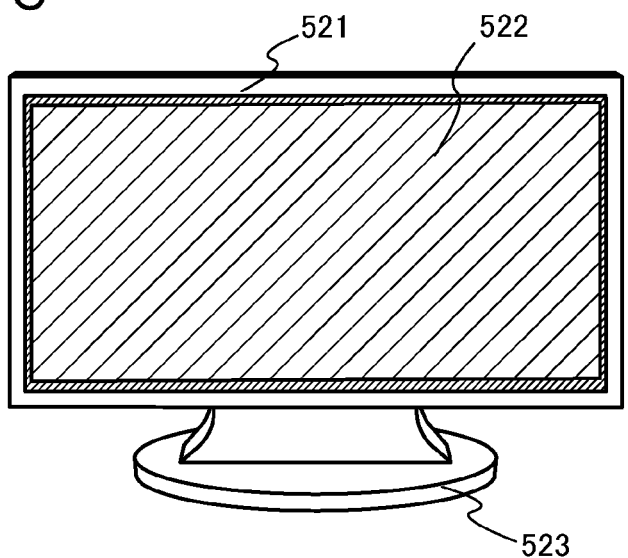

FIG. 17C illustrates an example of the television device. In the television device illustrated in FIG. 17C, a display portion 522 is incorporated in a housing 521. The display portion 522 can display an image. Further, the housing 521 is supported by a stand 523 here. The display device described in Embodiment 5 or 6 can be applied to the display portion 522.

The television device illustrated in FIG. 17C can be operated with an operation switch of the housing 521 or a separate remote controller. Channels and volume can be controlled with an operation key of the remote controller so that an image displayed in the display portion 522 can be controlled. Further, the remote controller may be provided with a display portion for displaying data output from the remote controller.

Note that the television device illustrated in FIG. 17C may be provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 17D:
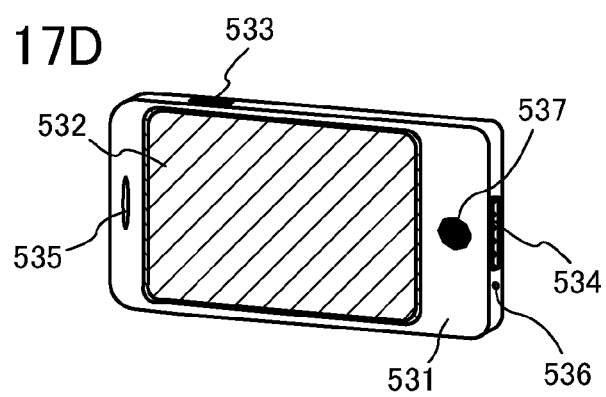

FIG. 17D illustrates an example of the mobile phone. The mobile phone illustrated in FIG. 17D is provided with a display portion 532 incorporated in a housing 531, an operation button 533, an operation button 537, an external connection port 534, a speaker 535, a microphone 536, and the like. Any of the display devices described in Embodiments 5 and 6 can be applied to the display portion 532.

The display portion 532 of the mobile phone illustrated in FIG. 17D is a touch panel. When the display portion 532 is touched with a finger or the like, contents displayed on the display portion 532 can be controlled. Further, operations such as making calls and composing mails can be performed by touching the display portion 532 with a finger or the like.

There are mainly three screen modes for the display portion 532. The first mode is a display mode mainly for displaying images. The second mode is an input mode mainly for inputting data such as text. The third mode is a display-and-input mode in which two modes of the display mode and the input mode are combined.

For example, in the case where a call is made or a mail is composed, a text input mode mainly for inputting text is selected for the display portion 532 so that characters displayed on a screen can be input. In that case, it is preferable to display a keyboard or number buttons on a large area of the screen of the display portion 532.

When a detection device including a sensor for detecting inclination, such as a gyroscope or an acceleration sensor, is provided inside the mobile phone illustrated in FIG. 17D, the mode (display data) of the display portion 532 can be automatically switched by determining the orientation of the mobile phone (whether the mobile phone is placed horizontally or vertically for a landscape mode or a portrait mode).

The screen modes are switched by touching the display portion 532 or using the operation button 537 of the housing 531. Alternatively, the screen modes can be switched depending on kinds of images displayed on the display portion 532. For example, when a signal of an image displayed on the display portion is the one of moving image data, the screen mode can be switched to the display mode. When the signal is the one of text data, the screen mode can be switched to the input mode.

Further, in the input mode, when input by touching the display portion 532 is not performed for a certain period of time while a signal detected by an optical sensor in the display portion 532 is detected, the screen mode may be controlled so as to be switched from the input mode to the display mode.

The display portion 532 can also function as an image sensor. For example, an image of a palm print, a fingerprint, or the like is taken by an image sensor when the display portion 532 is touched with a palm or a finger, whereby personal authentication can be performed. Further, by providing a backlight or a sensing light source which emits near-infrared light in the display portion, an image of a finger vein, a palm vein, or the like can be taken.

This embodiment can be implemented in appropriate combination with any of the structures described in the other embodiments.

Embodiment 9

A photoelectric conversion device will be described in this embodiment.

A photoelectric conversion device can be manufactured using the microcrystalline semiconductor layer described in Embodiment 1 or 2. As a semiconductor layer used in the photoelectric conversion device, a semiconductor layer effective in photoelectric conversion, a semiconductor layer having a conductivity type, or the like can be used, and in particular, a microcrystalline semiconductor layer is preferably used for a semiconductor layer effective in photoelectric conversion. Alternatively, a microcrystalline semiconductor layer described in Embodiment 1 or 2 can be formed at an interface between the semiconductor layer effective in photoelectric conversion or the semiconductor layer having a conductivity type and another film.

By employing the structure described above, resistance (series resistance) caused by the semiconductor layer effective in photoelectric conversion or the semiconductor layer having a conductivity type can be reduced, resulting in improvement of properties. Further, it is possible to suppress optical and electrical loss at the interface between the semiconductor layer effective in photoelectric conversion or the semiconductor layer having a conductivity type and another film, so that the photoelectric conversion efficiency can be improved. Description is made below with reference to FIG. 18.

Figure 18:
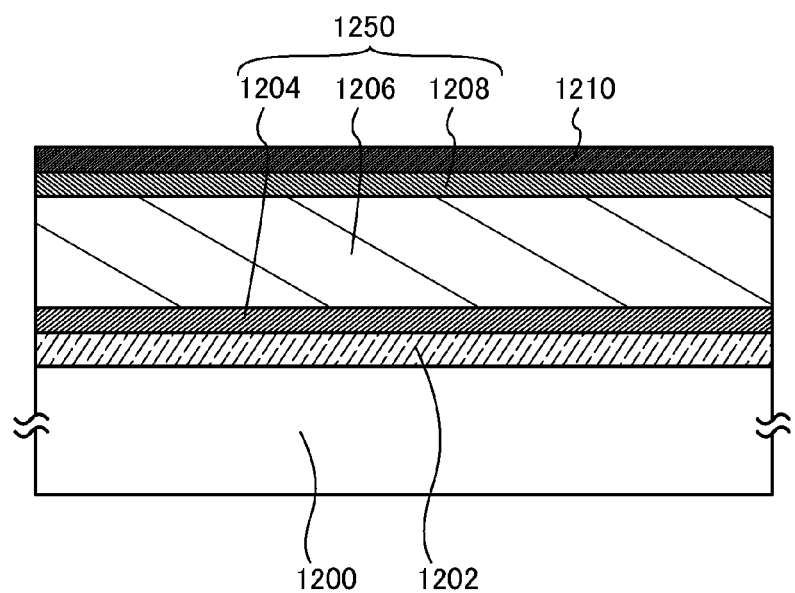
FIG. 18 illustrates a structure of a photoelectric conversion device.

A photoelectric conversion device illustrated in FIG. 18 includes a substrate 1200, a first electrode 1202, a unit cell 1250, and a second electrode 1210. A semiconductor layer 1204 exhibiting a first conductivity type, a semiconductor layer 1206 effective in photoelectric conversion, and a semiconductor layer 1208 exhibiting a second conductivity type are stacked to form the unit cell 1250. Here, the microcrystalline semiconductor layer described in Embodiment 1 or 2 can be used for the semiconductor layer 1206 effective in photoelectric conversion. Although a structure in which light enters from the bottom surface side of the substrate 1200 (the lower side in the diagram) is described in this embodiment, an embodiment of the present invention is not limited thereto. Light may enter from a second electrode 1210 side (the upper side in the diagram).

As the substrate 1200, typically, a variety of glass substrates used in the electronics industry, such as substrates of aluminosilicate glass, barium borosilicate glass, or aluminoborosilicate glass can be employed. Alternatively, a quartz substrate, a sapphire substrate, or the like can be used. Further, a substrate including an organic material can be used. As the substrate including an organic material, it is preferable to use a substrate including a thermosetting resin such as an epoxy resin, an unsaturated polyester resin, a polyimide resin, a bismaleimide-triazine resin, or a cyanate resin, or a substrate including a thermoplastic resin such as a polyphenylene oxide resin, a polyetherimide resin, or a fluorine resin.

A texture structure or the like may be provided for a surface of the substrate 1200. Accordingly, photoelectric conversion efficiency can be improved.

Note that in this embodiment, a light-transmitting substrate is used since a structure in which light enters from the bottom surface side of the substrate 1200 (the lower side in the diagram) is employed. However, when the structure in which light enters from the second electrode 1210 side (an upper side in the diagram) is employed, the substrate is not limited to a light-transmitting substrate. In such a case, a semiconductor substrate including a material such as silicon or a conductive substrate including a metal material may be used.

As the first electrode 1202, an electrode formed using a conductive material having a light-transmitting property is typically employed. Examples of the conductive material having a light-transmitting property include the following oxides (metal oxides): an In—Sn—Zn—O-based oxide; an In—Al—Zn—O-based oxide; a Sn—Ga—Zn—O-based oxide; an Al—Ga—Zn—O-based oxide; a Sn—Al—Zn—O-based oxide; an In—Zn—O-based oxide; a Sn—Zn—O-based oxide; an Al—Zn—O-based oxide; an In—O-based oxide; a Sn—O-based oxide; and a Zn—O-based oxide. In particular, an indium oxide, an alloy of indium oxide and tin oxide (ITO), a zinc oxide, an alloy of indium oxide and zinc oxide, or the like is preferably used. Alternatively, a Zn—O—Al—N-based material can be used. Further, the conductive material having a light-transmitting property is not limited to an inorganic material and may be an organic material. As the organic material, a material (a conductive high molecular material) including polyaniline, polypyrrole, or polythiophene, or a derivative thereof can be used.

Note that in this embodiment, the first electrode 1202 formed using the conductive material having a light-transmitting property is used since a structure in which light enters from the bottom surface side of the substrate 1200 (the lower side in the diagram) is employed. However, when the structure in which light enters from the second electrode 1210 side (the upper side in the diagram) is employed, a conductive material having no light-transmitting properties, such as aluminum, platinum, gold, silver, copper, titanium, tantalum, or tungsten can be used. In particular, when a material that easily reflects light such as aluminum, silver, titanium, or tantalum is used, photoelectric conversion efficiency can be sufficiently improved.

A texture structure or the like may be provided for a surface of the first electrode 1202 in a manner similar to the surface of the substrate 1200. Further, an auxiliary electrode formed using a low-resistant conductive material may be formed to be in contact with the first electrode 1202.

As the semiconductor layer 1204 exhibiting the first conductivity type and the semiconductor layer 1208 exhibiting the second conductivity type, a semiconductor layer including a semiconductor material to which an impurity element imparting a conductivity type is added is typically employed. As the semiconductor material, silicon is preferably used in view of productivity, cost, and the like. In the case of using silicon as the semiconductor material, boron (B) or the like is employed for a p-type impurity semiconductor, and phosphorus (P), arsenic (As), or the like is employed for an n-type impurity semiconductor. In this embodiment, the case in which silicon is used as the semiconductor material, the semiconductor layer 1204 is of p-type, and the semiconductor layer 1208 is of n-type is described. It is needless to say that an embodiment of the disclosed invention is not limited to this case. The semiconductor layer 1204 may be of n-type, and the semiconductor layer 1208 may be of p-type.

There are other semiconductor materials which can be used for the semiconductor layer 1204 and the semiconductor layer 1208, such as silicon carbide, germanium, gallium arsenide, indium phosphide, zinc selenide, gallium nitride, and silicon germanium. Alternatively, a semiconductor material including an organic material, a semiconductor material including a metal oxide, or the like can be used. The material which can be used for the semiconductor layer 1204 and the semiconductor layer 1208 can be selected as appropriate in consideration of the semiconductor layer 1206 effective in photoelectric conversion.

A microcrystalline semiconductor layer is preferably used for the semiconductor layer 1204 and the semiconductor layer 1208 because series resistance can be reduced and optical and electrical loss at the interface with another film can be suppressed. However, this embodiment is not limited to this, and other semiconductors such as an amorphous semiconductor, a polycrystalline semiconductor, and a single crystal semiconductor may be used.

Note that a texture structure or the like may be provided for a surface of the semiconductor layer 1204 and a surface of the semiconductor layer 1208 in a manner similar to the surface of the substrate 1200.

For the semiconductor layer 1206 effective in photoelectric conversion, the semiconductor material which is the same as that of the semiconductor layer 1204 and the semiconductor layer 1208 is used. That is, as the semiconductor material, silicon, silicon carbide, germanium, gallium arsenide, indium phosphide, zinc selenide, gallium nitride, silicon germanium, or the like is used. In particular, it is preferable to use silicon. Alternatively, a semiconductor material including an organic material, a semiconductor material including a metal oxide, or the like can be used.

A microcrystalline semiconductor layer is preferably used for the semiconductor layer 1206. With the use of a microcrystalline semiconductor layer, series resistance can be reduced and optical and electrical loss at the interface with another film can be suppressed.

Note that a texture structure or the like may be provided for a surface of the semiconductor layer 1206 in a manner similar to the surface of the substrate 1200.

As the second electrode 1210, an electrode using a metal material, such as aluminum, platinum, gold, silver, copper, titanium, tantalum, or tungsten, is typically used. In particular, a material that easily reflects light such as aluminum, silver, titanium, or tantalum is preferably used because light that cannot be absorbed by the semiconductor layer 1206 can enter the semiconductor layer 1206 again; thus, photoelectric conversion efficiency can be improved.

Note that in this embodiment, the above-mentioned structure is used since the structure in which light enters from the bottom surface side of the substrate 1200 (the lower side in the diagram) is employed. However, the structure of the second electrode 1210 is not limited thereto. A conductive material having a light-transmitting property may be used for forming the second electrode 1210 as well as the first electrode 1202.

A texture structure or the like may be provided for a surface of the second electrode 1210. Further, an auxiliary electrode formed using a low-resistant conductive material may be formed to be in contact with the second electrode 1210.

As described above, when a microcrystalline semiconductor layer is used for any or all of the semiconductor layer 1206 effective in photoelectric conversion, the semiconductor layer 1204 exhibiting the first conductivity type, and the semiconductor layer 1208 exhibiting the second conductivity type, the conversion efficiency of the photoelectric conversion device can be increased.

Note that a plurality of unit cells 1250 can be stacked.

Embodiment 10

Figure 19:
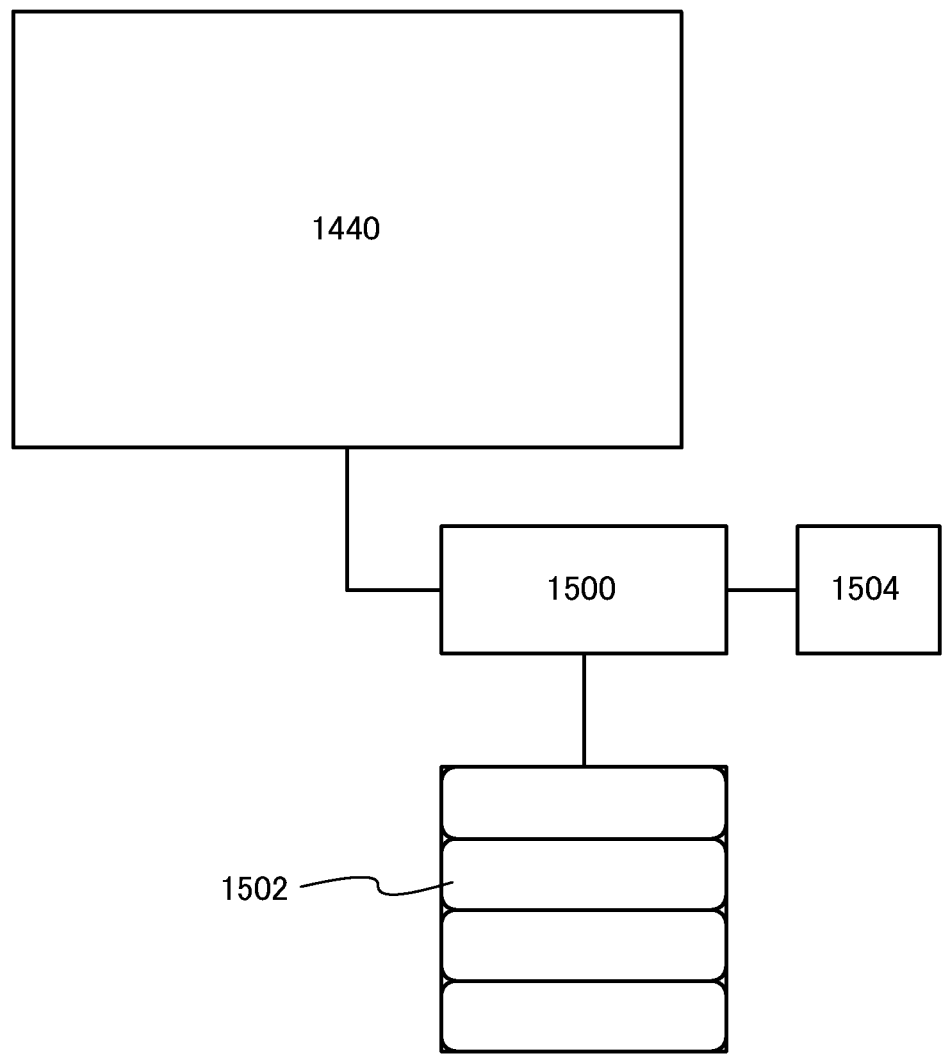
FIG. 19 illustrates a structure of a solar photovoltaic system.

A solar photovoltaic module can be manufactured using the photoelectric conversion device described in Embodiment 9. FIG. 19 illustrates an example of a solar photovoltaic system using the solar photovoltaic module 1440. A storage battery 1502 is charged using power of a charge control circuit 1500, which is supplied from one or a plurality of solar photovoltaic modules 1440. Further, when the storage battery 1502 is sufficiently charged, the power supplied from the solar photovoltaic module 1440 is output directly to a load 1504.

When an electric double layer capacitor is used as the storage battery 1502, the storage battery 1502 can be charged rapidly because chemical reaction is not needed for the charging. Further, lifetime can be increased to about 8 times as long as and charging and discharging efficiency can be increased to about 1.5 times as high as those of a lead storage battery or the like which uses chemical reaction. The solar photovoltaic system described in this embodiment can be used for various types of loads 1504 which use electric power, such as lighting or an electronic device.

Example 1

In this example, a microcrystalline semiconductor layer is formed over a substrate using the method disclosed in Embodiment 1. A glass substrate with a thickness of 0.7 mm (EAGLE XG manufactured by Corning, Inc.) which was cut to 5 inches on each side was used.

Silane ($SiH_4$), which is a deposition gas, at a flow rate of 8 sccm and hydrogen at a flow rate of 400 sccm are supplied to a reaction chamber through a shower plate of an upper electrode. At the same time, argon (Ar), which is a rare gas, at a flow rate of 400 sccm is supplied to the reaction chamber from a supply tube provided on a side surface of the reaction chamber.

The substrate was heated to 280° C., and plasma was generated under the following conditions: the gap was 20 mm, the frequency of the high-frequency power was 60 MHz, and the power density was 40 mW/cm$^2$. Then, deposition was performed for 3 minutes.

After the deposition, the thickness of a deposited film was measured with a spectroscopic ellipsometer. The thickness measurement was performed on 25 points at regular intervals in a region of 100 mm×100 mm in the central portion of the substrate (a region which is approximately 10 mm inward than an end of the substrate), and the deposition rate and the uniformity of the film thickness within a surface were calculated from the average thickness, the maximum thickness, and the minimum thickness.

As a result, a deposition rate of 8.2 nm/min. and a uniformity of ±5.7% were obtained.

In the case where silane ($SiH_4$), hydrogen, and argon are supplied from a shower plate of an upper electrode using a plasma CVD apparatus with a conventional structure and the other conditions are the same as those described above, a deposition rate of 5.5 nm/min. and a uniformity of ±7.2% were obtained.

As described above, by using the method disclosed in Embodiment 1, deposition rate and uniformity in deposition of a microcrystalline semiconductor layer can be improved.

Example 2

In this example, a microcrystalline semiconductor layer is formed over a substrate using the method disclosed in Embodiment 2.

In this example, when argon (Ar), which is a rare gas, is supplied to a reaction chamber from a supply tube which is provided on a side surface of the reaction chamber, argon is excited by an inductively coupled plasma (ICP) method in advance and then is supplied to the reaction chamber. Note that the flow rate was set to 400 sccm which was the same as that in Example 1.

The other conditions were the same as those in Example 1. That is, silane ($SiH_4$) at a flow rate of 8 sccm and hydrogen at a flow rate of 400 sccm are supplied from a shower plate of an upper electrode. The substrate was heated to 280° C., and plasma was generated under the following conditions: the gap was 20 mm, the frequency of the high-frequency power was 60 MHz, and the power density was 40 mW/cm$^2$. Then, deposition was performed for 3 minutes.

After the deposition, the thickness of a deposited film was measured with a spectroscopic ellipsometer. The thickness measurement was performed on 25 points at regular intervals in a region of 100 mm×100 mm in the central portion of the substrate (a region which is approximately 10 mm inward than an end of the substrate), and the deposition rate and the uniformity of the film thickness within a surface were calculated from the average thickness, the maximum thickness, and the minimum thickness.

As a result, a deposition rate of 8.3 nm/min. and a uniformity of ±1.9% were obtained.

As described above, by using the method disclosed in Embodiment 2, deposition rate and uniformity in deposition of a microcrystalline semiconductor layer can be improved.

This application is based on Japanese Patent Application serial no. 2009-244375 filed with Japan Patent Office on Oct. 23, 2009, the entire contents of which are hereby incorporated by reference.

What is claimed is:

1. A method for manufacturing a microcrystalline semiconductor layer using a plasma CVD apparatus comprising an upper electrode and a lower electrode in a reaction chamber, comprising the steps of:

placing a substrate over the lower electrode;

supplying a deposition gas and hydrogen to the reaction chamber through the upper electrode;

supplying a rare gas to the reaction chamber from a portion different from the upper electrode; and generating plasma by supplying high-frequency power to the upper electrode, thereby forming the microcrystalline semiconductor layer over the substrate.

2. The method for manufacturing a microcrystalline semiconductor layer according to claim 1, wherein the rare gas is supplied through a supply tube provided on a side surface of the reaction chamber.

3. The method for manufacturing a microcrystalline semiconductor layer according to claim 1, wherein the rare gas is supplied to the reaction chamber in an excitation state.

4. The method for manufacturing a microcrystalline semiconductor layer according to claim 1, wherein the deposition gas is a gas containing silicon or germane.

5. The method for manufacturing a microcrystalline semiconductor layer according to claim 1, wherein the rare gas is a gas containing argon.

6. A method for manufacturing a microcrystalline semiconductor layer using a plasma CVD apparatus comprising an upper electrode and a lower electrode in a reaction chamber, comprising the steps of:

placing a substrate over the lower electrode;

supplying a deposition gas and hydrogen to the reaction chamber through a shower plate of the upper electrode;

supplying a rare gas to the reaction chamber from a portion different from the upper electrode; and generating plasma by supplying high-frequency power to the upper electrode, thereby forming the microcrystalline semiconductor layer over the substrate.

7. The method for manufacturing a microcrystalline semiconductor layer according to claim 6, wherein the rare gas is supplied through a supply tube provided on a side surface of the reaction chamber.

8. The method for manufacturing a microcrystalline semiconductor layer according to claim 6, wherein the rare gas is supplied to the reaction chamber in an excitation state.

9. The method for manufacturing a microcrystalline semiconductor layer according to claim 6, wherein the deposition gas is a gas containing silicon or germane.

10. The method for manufacturing a microcrystalline semiconductor layer according to claim 6, wherein the rare gas is a gas containing argon.

* * * * *